United States Patent
Lee et al.

(10) Patent No.: US 9,419,013 B1
(45) Date of Patent: Aug. 16, 2016

(54) SEMICONDUCTOR DEVICE AND METHOD OF MANUFACTURING THE SAME

(71) Applicants: Dong Sik Lee, Osan-si (KR); Woong Seop Lee, Hwaseong-si (KR); Seok Cheon Baek, Hwaseong-si (KR); Byung Jin Lee, Seoul (KR)

(72) Inventors: Dong Sik Lee, Osan-si (KR); Woong Seop Lee, Hwaseong-si (KR); Seok Cheon Baek, Hwaseong-si (KR); Byung Jin Lee, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/956,539

(22) Filed: Dec. 2, 2015

Related U.S. Application Data

(60) Provisional application No. 62/238,881, filed on Oct. 8, 2015.

(30) Foreign Application Priority Data

Nov. 2, 2015 (KR) .................. 10-2015-0153303

(51) Int. Cl.
*H01L 27/11* (2006.01)
*H01L 27/115* (2006.01)
*H01L 29/423* (2006.01)
*H01L 23/535* (2006.01)

(52) U.S. Cl.
CPC ........ *H01L 27/11582* (2013.01); *H01L 23/535* (2013.01); *H01L 27/11556* (2013.01); *H01L 29/42372* (2013.01)

(58) Field of Classification Search
CPC .............. H01L 27/11582; H01L 29/7926; H01L 27/11556; H01L 27/1157; H01L 29/66833; H01L 27/11551; H01L 29/7889; H01L 29/66825; H01L 27/11578; H01L 27/11524; H01L 27/11565; H01L 27/11519; H01L 21/2827

See application file for complete search history.

(56) References Cited

U.S. PATENT DOCUMENTS

| | | | |
|---|---|---|---|
| 8,728,889 B2 | 5/2014 | Lee et al. | |
| 8,822,285 B2 | 9/2014 | Hwang et al. | |
| 8,828,884 B2 | 9/2014 | Lee et al. | |
| 8,871,591 B2 | 10/2014 | Kwon et al. | |
| 8,928,149 B2 | 1/2015 | Chen | |
| 2010/0207195 A1 | 8/2010 | Fukuzumi et al. | |
| 2012/0061743 A1 | 3/2012 | Watanabe et al. | |
| 2013/0056818 A1 | 3/2013 | Iino et al. | |
| 2014/0162420 A1 | 6/2014 | Oh et al. | |
| 2014/0191389 A1 | 7/2014 | Lee et al. | |
| 2014/0199815 A1 | 7/2014 | Hwang et al. | |
| 2014/0225183 A1 | 8/2014 | Park et al. | |
| 2014/0264934 A1 | 9/2014 | Chen | |

(Continued)

FOREIGN PATENT DOCUMENTS

| | | |
|---|---|---|
| JP | 2009-146954 A | 7/2009 |
| JP | 2012-059966 A | 3/2012 |

(Continued)

*Primary Examiner* — Roy Potter
*Assistant Examiner* — Paul Patton
(74) *Attorney, Agent, or Firm* — Lee & Morse, P.C.

(57) ABSTRACT

A semiconductor device, including gate electrodes perpendicularly stacked on a substrate; channel holes extending perpendicularly to the substrate, the channel holes penetrating through the gate electrodes, the channel holes having a channel region; gate pads extended from the gate electrodes by different lengths; and contact plugs connected to the gate pads, at least a portion of the gate pads having a region having a thickness less than a thickness of the gate electrode connected to the at least a portion of the gate pads.

15 Claims, 28 Drawing Sheets

(56) References Cited

U.S. PATENT DOCUMENTS

| | | |
|---|---|---|
| 2014/0293703 A1 | 10/2014 | Jeong et al. |
| 2014/0306279 A1 | 10/2014 | Park et al. |
| 2014/0367759 A1 | 12/2014 | Lee et al. |
| 2015/0035065 A1 | 2/2015 | Park et al. |
| 2015/0064900 A1 | 3/2015 | Lee et al. |
| 2015/0187789 A1* | 7/2015 | Lee .................. H01L 27/11582 257/326 |
| 2015/0255468 A1 | 9/2015 | Chen |
| 2015/0263029 A1 | 9/2015 | Kim et al. |

FOREIGN PATENT DOCUMENTS

| | | |
|---|---|---|
| JP | 2013-055136 A | 3/2013 |
| KR | 10-2014-0089793 A | 7/2014 |
| KR | 10-2015-0085591 A | 7/2015 |

* cited by examiner

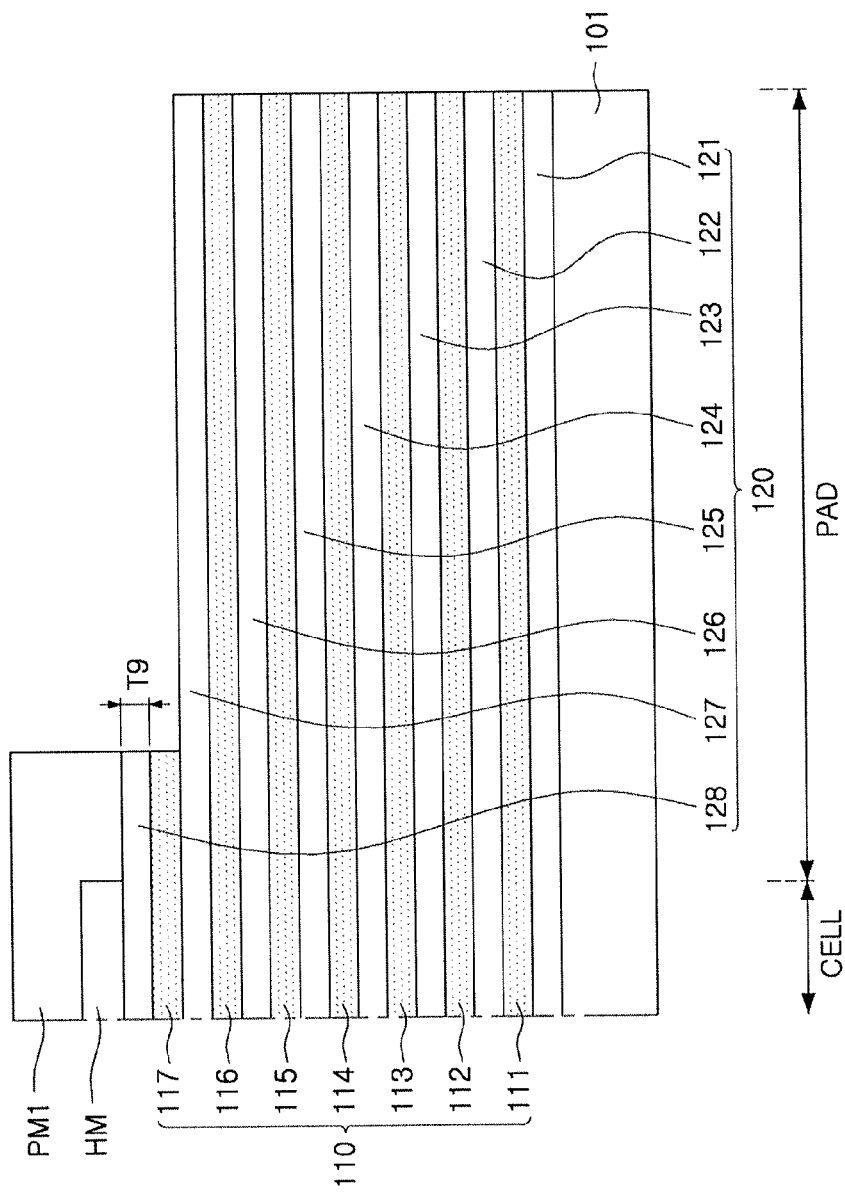

SEMICONDUCTOR DEVICE AND METHOD OF MANUFACTURING THE SAME

CROSS-REFERENCE TO RELATED APPLICATIONS

This U.S. Non-Provisional application claims priority under 35 USC §119 to U.S. Provisional Application No. 62/238,881 filed on Oct. 8, 2015 in the USPTO, which is incorporated by reference herein in its entirety and for all purposes.

Korean Patent Application No. 10-2015-0153303, filed on Nov. 2, 2015, in the Korean Intellectual Property Office, and entitled: "Semiconductor Device and Method of Manufacturing the Same," is incorporated by reference herein in its entirety.

BACKGROUND

1. Field

Embodiments relate to a semiconductor device and a method of manufacturing the same.

2. Description of the Related Art

Market demand may exist for electronic products able to process large amounts of data, while volumes thereof may be reduced. Degrees of integration of semiconductor devices used in such electronic products may need to be increased.

SUMMARY

Embodiments may be realized by providing a semiconductor device, including gate electrodes perpendicularly stacked on a substrate; channel holes extending perpendicularly to the substrate, the channel holes penetrating through the gate electrodes, the channel holes having a channel region; gate pads extended from the gate electrodes by different lengths; and contact plugs connected to the gate pads, at least a portion of the gate pads having a region having a thickness less than a thickness of the gate electrode connected to the at least a portion of the gate pads.

The gate pads may include contact regions in which lower gate pads extend further than upper gate pads connected to the contact plugs, and a thickness of the gate pad in the contact region may be less than a thickness of the gate electrode.

The gate pads may have thicknesses less than thicknesses of the gate electrodes in an entirety of the contact regions.

The gate pads may have thicknesses continuously and gradually reduced in the contact regions.

Each of the gate pads may have a curved portion in which a thickness of the gate pad is discontinuously and rapidly reduced in a vicinity of the contact region, each of the gate pads extending horizontally in a region except for the curved portion.

A difference in thicknesses between the gate pads and the gate electrodes connected to the gate pads may be different in each of the gate pads.

The difference in thicknesses in the gate pads may be increased in an upward direction from an upper surface of the substrate.

The difference in thicknesses in the gate pads may be increased in an upward direction from an upper surface of the substrate among group units including two or more of the gate pads.

The semiconductor device may further include an etch-stop layer on the gate pads. The contact plugs may penetrate through the etch-stop layer.

The etch-stop layer may be in contact with the gate pads.

Embodiments may be realized by providing a semiconductor device, including gate electrodes stacked perpendicularly on a substrate; gate pads having contact regions, the gate pads extending from the gate electrodes by different lengths; and contact plugs connected to the gate pads in the contact regions, at least a portion of the gate pads having a reduced thickness in the contact regions.

The contact regions may include regions in which a lower gate pad among the gate pads extends further than an upper gate pad among the gate pads.

Each of the gate pads may have a step portion or a curved portion such that each of the gate pads has the reduced thickness in the contact regions.

A difference in thicknesses of the gate electrode and the gate pad connected to the gate electrode may be in a range of about 5 Å to about 100 Å.

A degree of reduction in thicknesses of the gate pads may be in proportion to or in inverse proportion to a distance between the gate pads and the substrate.

Embodiments may be realized by providing a method of manufacturing a semiconductor device, the method including alternately stacking sacrificial layers and interlayer insulating layers on a substrate; forming a mask layer on the sacrificial layers and the interlayer insulating layers stacked on one another; forming a pad region by removing portions of the sacrificial layers and the interlayer insulating layers to extend by different lengths using the mask layer; forming a pad insulating layer including an oxide-based material in the pad region; removing the sacrificial layers; and forming gate electrodes by filling regions from which the sacrificial layers are removed with a conductive material, in forming the pad insulating layer, at least portions of the sacrificial layers in the pad region being oxidized to form oxide layers.

Portions of the sacrificial layers may be oxidized from upper surfaces of the sacrificial layers by a source material for formation of the pad insulating layer.

In removing the sacrificial layers, the oxide layer may remain without being removed.

Each of the gate electrodes may have a reduced thickness below the oxide layer.

A thickness of the oxide layer may be increased away from an upper surface of the substrate.

Embodiments may be realized by providing a semiconductor device, including gate electrodes stacked on a substrate; and gate pads extending from each of the gate electrodes, each of the gate pads extending a different length from each of the gate electrode; each of the gate pads having a reduced thickness in a region extending longer than an upper gate pad among the gate pads.

At least one of the gate pads may have a recess-shaped curved portion that provides the gate pad extending therefrom the reduced thickness.

The gate pad extending from the at least one of the gate electrodes having the recess-shaped curved portion may have an upper surface parallel to the substrate in an entirety of the region extending longer than an upper gate pad.

Each of the gate pads may include a contact region.

The semiconductor device may further include contact plugs connected to each of the contact regions.

DESCRIPTION OF THE DRAWINGS

Features will become apparent to those of skill in the art by describing in detail exemplary embodiments with reference to the attached drawings in which:

FIGS. 10A to 10K schematically illustrate drawings of principal processes of a method of manufacturing a semiconductor device according to an example embodiment;

DETAILED DESCRIPTION

Figure 1:
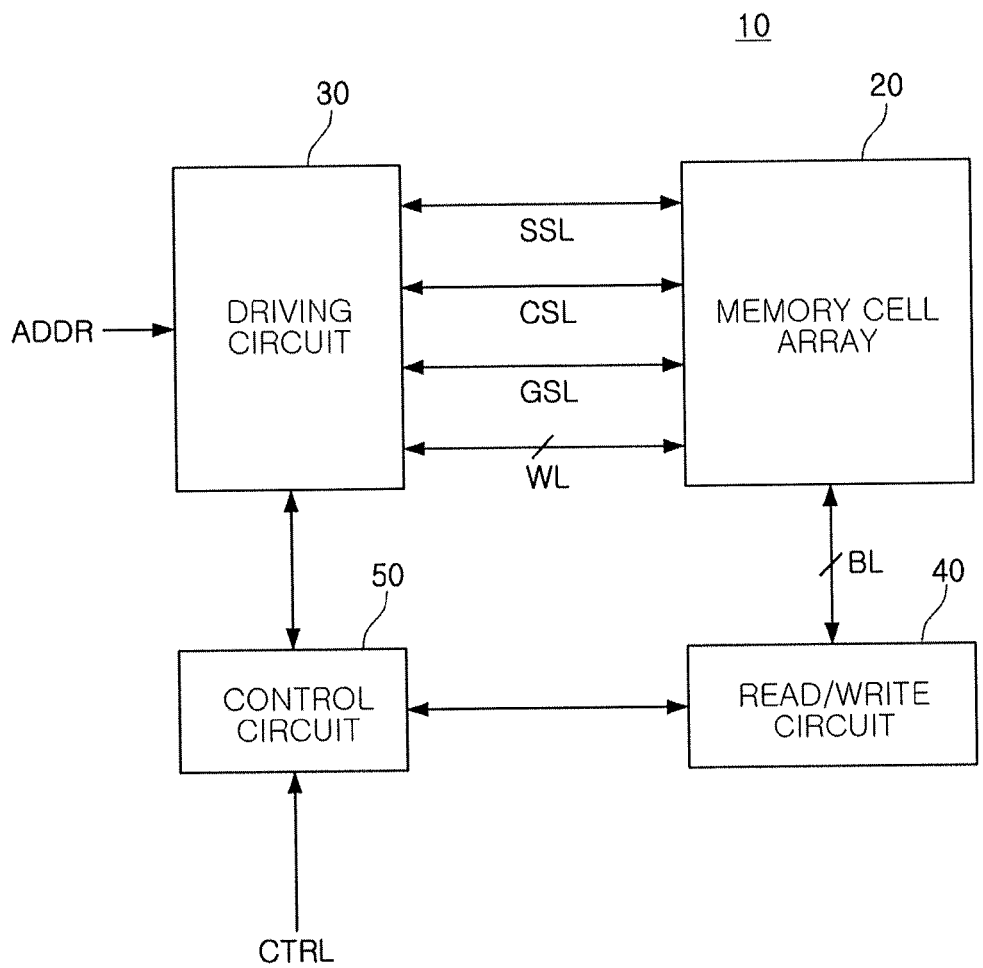
FIG. 1 illustrates a schematic block diagram of a semiconductor device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like numerals refer to like elements throughout. As used herein, the term "and/or" includes any and all combinations of one or more of the associated listed items.

It will be apparent that though the terms first, second, third, etc., may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the example embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments will be described with reference to schematic views illustrating embodiments. In the drawings, for example, due to manufacturing techniques and/or tolerances, modifications of the shape shown may be estimated. Thus, embodiments should not be construed as being limited to the particular shapes of regions shown herein, for example, to include a change in shape results in manufacturing. The following embodiments may also be constituted by one or a combination thereof.

The contents described below may have a variety of configurations and propose only a required configuration herein, but are not limited thereto.

In the present specification, the term "dummy" is only used as a term referring to a configuration only present as a pattern without performing an actual function, although the configuration is the same as other constituent elements or has a structure and a shape similar thereto. Thus, the "dummy" constituent element does not have an electrical signal applied thereto, nor does it perform a specific electrical function.

FIG. 1 illustrates a schematic block diagram of a semiconductor device according to an example embodiment.

With reference to FIG. 1, a semiconductor device 10 according to an example embodiment may include a memory cell array 20, a driving circuit 30, a read/write circuit 40, and a control circuit 50.

The memory cell array 20 may include a plurality of memory cells. The plurality of memory cells may be arranged in a plurality of rows and a plurality of columns. The plurality of memory cells included in the memory cell array 20 may be connected to the driving circuit 30 through a word line WL, a common source line CSL, a string select line SSL, a ground select line GSL, and the like, and may be connected to the read/write circuit 40 through a bit line BL. In example embodiments of the present disclosure, a plurality of memory cells arranged linearly in a single row may be connected to a single word line WL, and a plurality of memory cells arranged linearly in a single column may be connected to a single bit line BL.

The plurality of memory cells included in the memory cell array 20 may be divided into a plurality of memory blocks. A respective memory block may include a plurality of word lines WL, a plurality of string select lines SSL, a plurality of ground select lines GSL, a plurality of bit lines BL, and at least one common source line CSL.

The driving circuit 30 and the read/write circuit 40 may be operated by the control circuit 50. In an example embodiment, the driving circuit 30 may receive externally provided address information ADDR, and may decode the received address information ADDR to select at least a portion of the word line WL, the common source line CSL, the string select line SSL, and the ground select line GSL connected to the memory cell array. The driving circuit 30 may include a driving circuit for each of the word line WL, the string select line SSL, and the common source line CSL.

The read/write circuit 40 may select at least a portion of bit lines BL connected to the memory cell array 20 in response to a command provided from the control circuit 50. The read/write circuit 40 may read data written to a memory cell connected to the selected at least a portion of bit lines BL or may write data to a memory cell connected to the selected at least a portion of bit lines BL. The read/write circuit 40 may include a circuit such as a page buffer, an input/output buffer, a data latch, and the like.

The control circuit 50 may control operations of the driving circuit 30 and the read/write circuit 40 in response to a control signal CTRL transferred externally. In the case of reading data written to the memory cell array 20, the control circuit 50 may control operations of the driving circuit 30 to supply a voltage to the word line WL in which the data to be read is stored for a read operation. When the voltage for a read operation is supplied to a specific word line WL, the control circuit 50 may perform controlling so that the read/write circuit 40 may read data written to a memory cell connected to the word line WL having received the voltage for a read operation.

When data is written to the memory cell array 20, for example, the control circuit 50 may control operations of the driving circuit 30 to supply a voltage for a writing operation to a word line WL to which the data is to be written. When the voltage for a writing operation is supplied to a specific word line WL, the control circuit 50 may control the read/write circuit 40 to write data to a memory cell connected to the word line WL to which the voltage for a writing operation has been supplied.

Figure 2:
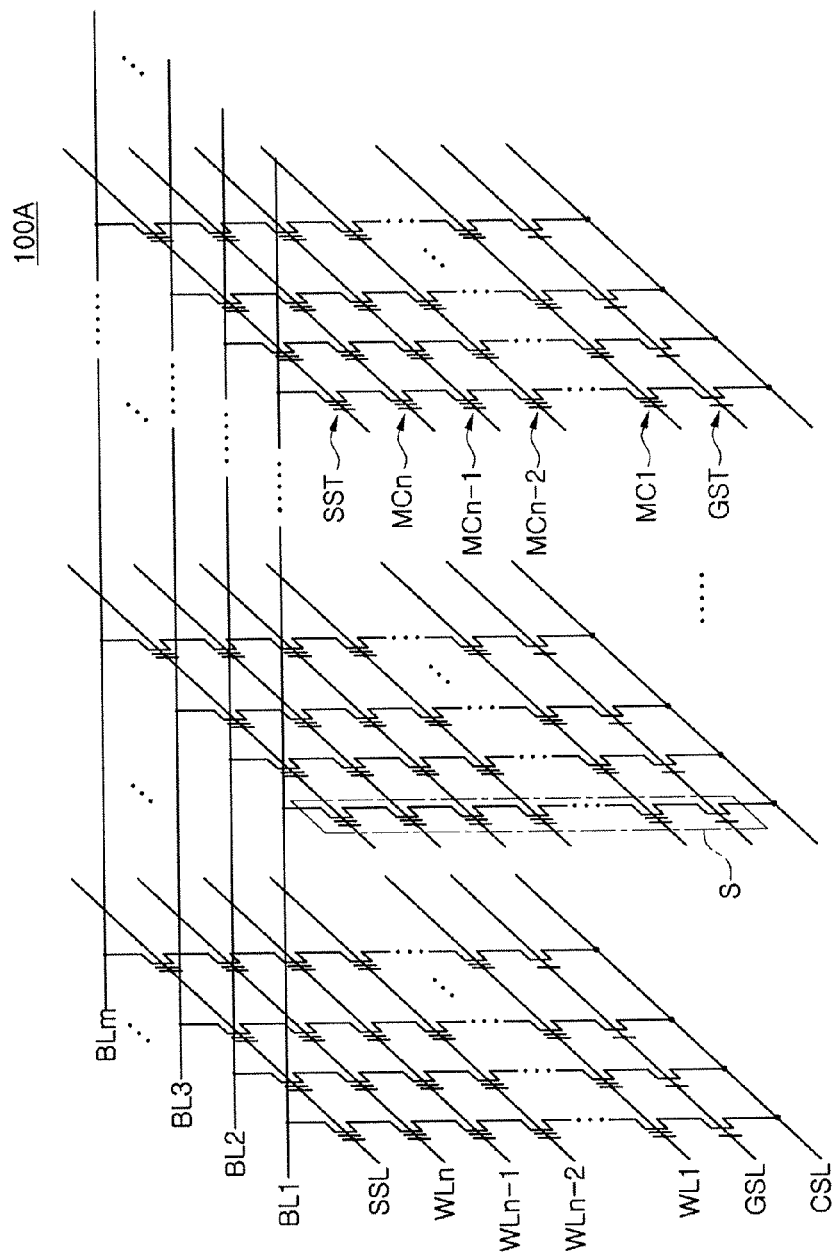
FIG. 2 illustrates an equivalent circuit diagram of a memory cell array of a semiconductor device according to an example embodiment.

FIG. 2 illustrates an equivalent circuit diagram of a memory cell array of a semiconductor device according to an example embodiment.

FIG. 2 illustrates an equivalent circuit diagram of a three-dimensional structure of a memory cell array included in a vertical semiconductor device 100A. Referring to FIG. 2, a memory cell array according to an example embodiment may include a plurality of memory cell strings S including n number of memory cells MC1 to MCn connected to one another in series, and a ground selection transistor GST and a string selection transistor SST respectively connected to two ends of the n number of memory cells MC1 to MCn in series.

The n number of memory cells MC1 to MCn connected to each other in series may be connected to word lines WL1 to WLn to select at least a portion of the n number of memory cells MC1 to MCn, respectively.

Gate terminals of the ground selection transistors GST may be connected to a ground select line GSL, and source terminals thereof may be connected to a common source line CSL. Gate terminals of the string selection transistors SST may be connected to a string select line SSL, and source terminals thereof may be connected to drain terminals of memory cells MCn. FIG. 2 illustrates a structure in which one ground selection transistor GST and one string selection transistor SST are respectively connected to the n number of memory cells MC1 to MCn connected to one another in series; in a manner different therefrom, a plurality of ground selection transistors GST or a plurality of string selection transistors SST may be connected thereto.

Drain terminals of the string selection transistors SST may be connected to bit lines BL1 to BLm. When a signal is applied to gate terminals of the string selection transistors SST through the string select line SSL, the signal applied through the bit lines BL1 to BLm may be transferred to the n number of memory cells MC1 to MCn connected to one another in series, such that a data read operation or a data writing operation may be performed. As a signal is applied to a gate terminal of the gate selection transistor GST of which a source terminal is connected to the common source line CSL, via the gate selection line, an erase operation in which charges stored in the n number of memory cells MC1 to MCn are overall removed may be performed.

Figure 3:
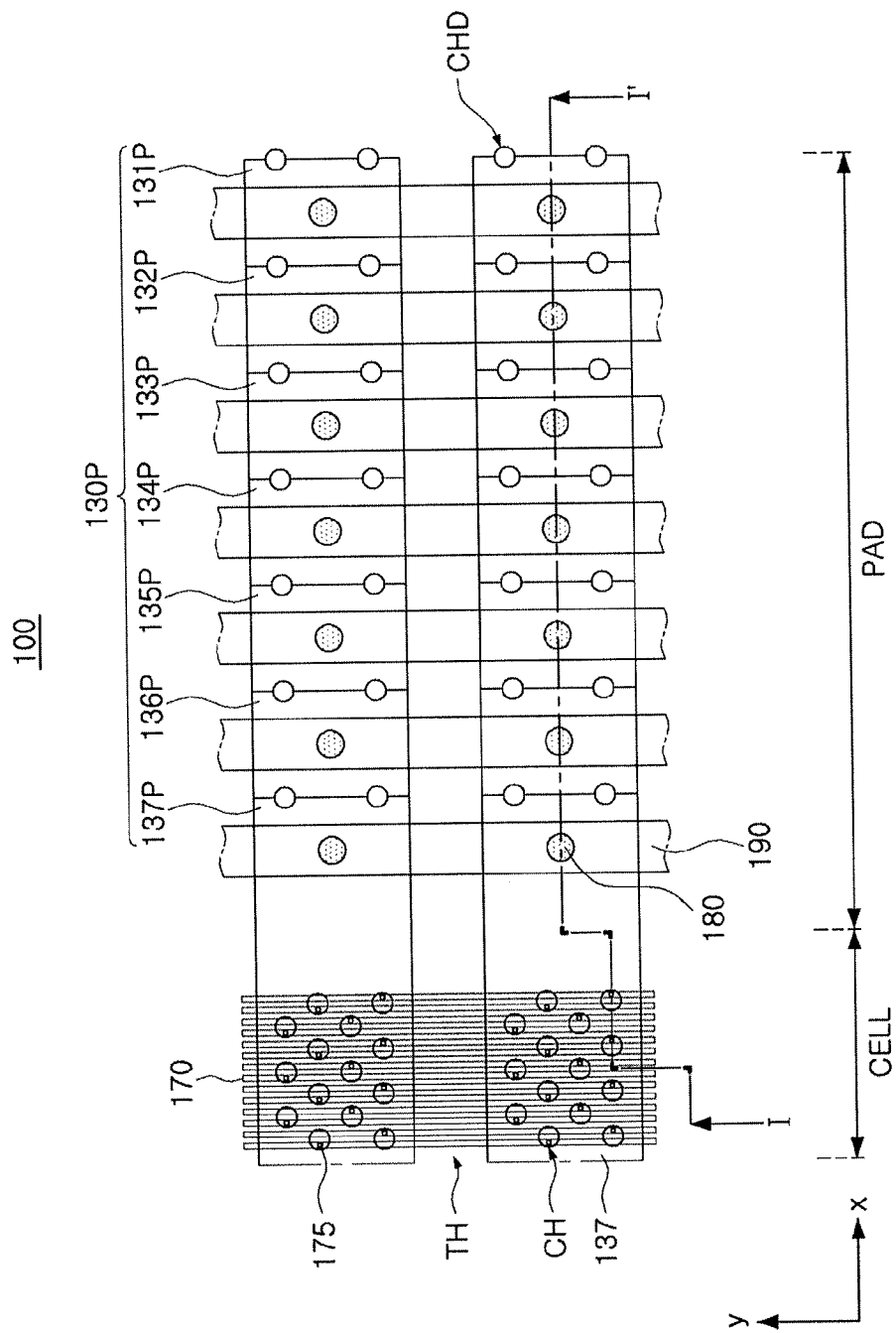
FIG. 3 illustrates a schematic plan view of a semiconductor device according to an example embodiment.

FIG. 3 illustrates a schematic plan view of a semiconductor device according to an example embodiment. FIG. 3 partially illustrates a structure of constituent elements from which some of configurations such as a pad insulating layer 129 (see FIG. 4) are omitted, for convenience of description.

Figure 4:
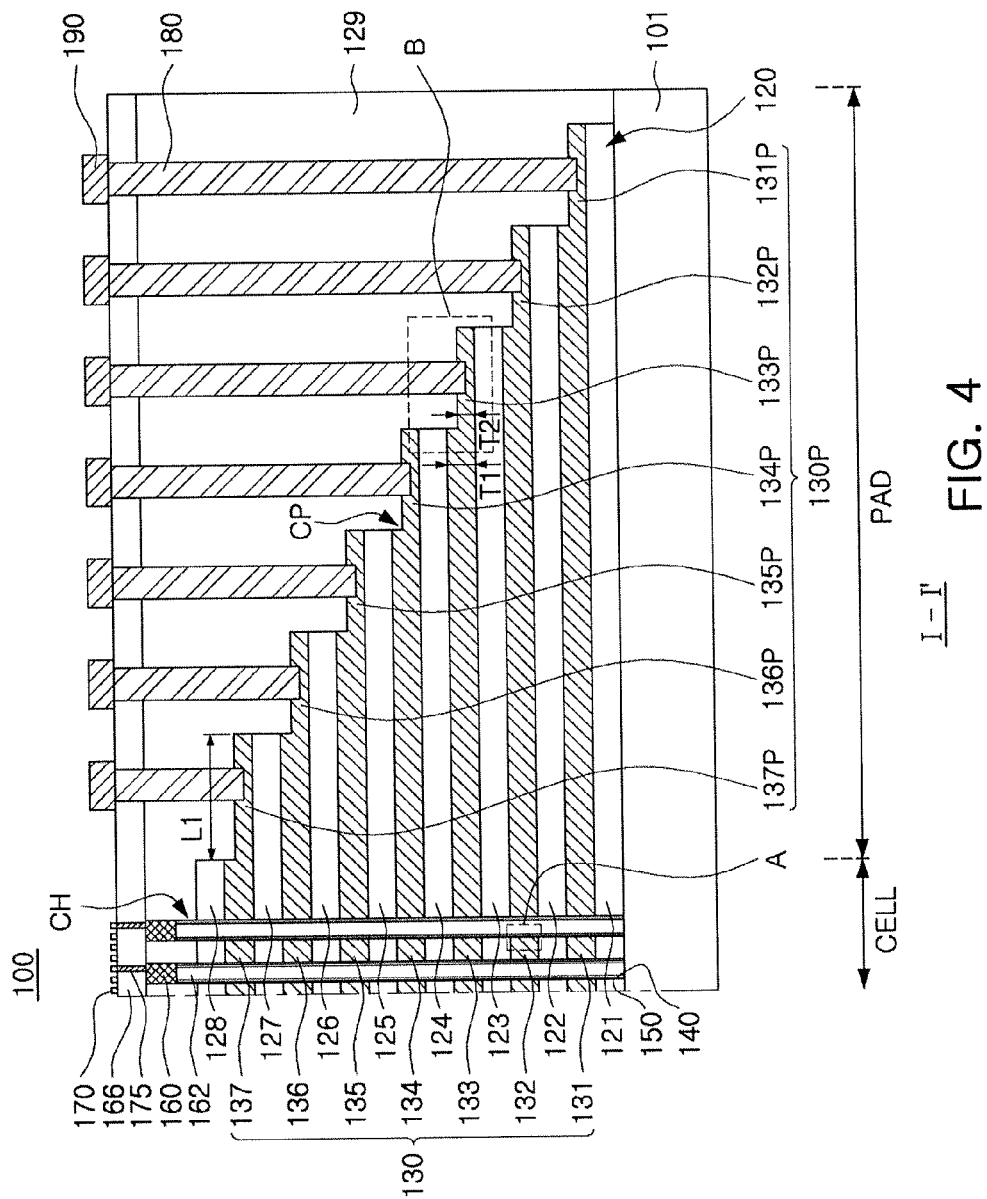
FIG. 4 illustrates a schematic cross-sectional view of a semiconductor device according to an example embodiment.

FIG. 4 illustrates a schematic cross-sectional view of a semiconductor device according to an example embodiment. FIG. 4 illustrates a cross section of the semiconductor device taken along line I-I' of FIG. 3.

With reference to FIGS. 3 and 4, a semiconductor device 100 may include a cell region CELL and a pad region PAD. The pad region PAD may be disposed on at least one end of the cell region CELL in an x direction. The cell region CELL may correspond to the memory cell array 20 of FIG. 1, and the pad region PAD may be a region electrically connecting the memory cell array 20 and the driving circuit 30 of FIG. 1 to each other.

In the cell region CELL, the semiconductor device 100 may include gate electrodes 131 to 137 (gate electrodes 130) stacked on a substrate 101 while being spaced apart from each other in a direction perpendicular to an upper surface of a substrate 101, interlayer insulating layers 121 to 127 (interlayer insulating layers 120) stacked alternately with the gate electrodes 130, channel holes CH which extends in a direction perpendicular to the upper surface of the substrate 101 and in which a channel region 140 is disposed, channel pads 160 disposed on upper ends of the channel holes CH, first wiring lines 170 and channel plugs 175 disposed on the channel pads 160. The semiconductor device 100 may further include a channel region 140 and a gate dielectric layer 150 within the channel holes CH. In the semiconductor device 100, a single memory cell string may be configured based on each channel hole CH, and a plurality of memory cell strings may be arranged in columns and rows in an x direction and a y direction.

In the pad region PAD, the semiconductor device 100 may include gate pads 131P to 137P (gate pads 130P) extending horizontally from the gate electrodes 131 to 137 (130), contact plugs 180 connected to the gate pads 130P, second wiring lines 190 disposed on the contact plugs 180, and dummy channel holes CHD having the same structure as the channel holes CH.

The substrate 101 may have an upper surface extending in an x direction and a y direction. The substrate 101 may include a semiconductor material, for example, a group IV semiconductor material, a group III-V compound semiconductor material, or a group II-VI oxide semiconductor material. For example, the group IV semiconductor may include silicon, germanium, or silicon-germanium. The substrate 101 may be provided as a bulk wafer or an epitaxial layer.

The gate electrodes 130, for example, 131 to 137, may be spaced apart from each other in a direction perpendicular to an upper surface of the substrate 101 along respective sides of the channel holes CH. With reference to FIG. 2, the gate electrodes 130 may respectively form gates of the ground selection transistor GST, the plurality of memory cells MC1 to MCn and the string selection transistor SST. The gate electrodes 130 may extend while forming word lines WL1 to WLn. The gate electrodes 130 may be commonly connected to memory cell strings adjacent to each other which are provided by a predetermined unit and are arranged in an x direction and y direction, and stacked structures in which the gate electrodes 130 are stacked may be separated from each other by a trench TH in a y direction as illustrated in FIG. 3.

In example embodiments, in the case of the gate electrodes 132 to 135 of the memory cells MC1 to MCn, four gate electrodes, for example, may be arranged. For example, the number of gate electrodes 130 forming the memory cells MC1 to MCn may be determined depending on a capacity of the semiconductor device 100. For example, the number of gate electrodes 130 forming the memory cells MC1 to MCn may be $2^n$, where n is a natural number.

The gate electrode 131 of the ground selection transistor GST may extend in an x direction to form the ground select line GSL. The gate electrodes 136 and 137 of the string selection transistor SST may extend in an x direction to form the string select line SSL. The channel holes CH linearly disposed in a y direction may be respectively connected to different first wiring lines 170 according to disposition of an upper wiring structure such as the channel plugs 175. In example embodiments, the gate electrodes 136 and 137 of the string selection transistor SST may be separated from each other between the channel holes CH linearly disposed in a y direction to form different string select lines SSL. According to an example embodiment, the gate electrodes 136 and 137 of the string selection transistor SST and the gate electrode 131 of the ground selection transistor GST may respectively be one, or two or more, and may have a structure the same as or different from those of the gate electrodes 132 to 135 of the memory cells MC1 to MCn.

A portion of the gate electrodes 130, for example, gate electrodes 130 adjacent to the gate electrode 131 of the ground selection transistor GST or the gate electrodes 136 and 137 of the string selection transistor SST may be dummy gate electrodes. For example, the gate electrode 132 adjacent to the gate electrode 131 of the ground selection transistor GST may be a dummy gate electrode.

The gate electrodes 130 may include polycrystalline silicon or a metal silicide material. The metal silicide material may be a silicide material of a metal selected from among, for example, cobalt (Co), nickel (Ni), hafnium (Hf), platinum (Pt), tungsten (W) and titanium (Ti), or may be a combination thereof. According to an example embodiment, the gate electrodes 130 may also include a metal, for example, tungsten (W). The gate electrodes 130 may further include a diffusion barrier layer, and for example, the diffusion barrier layer may include tungsten nitride (WN), tantalum nitride (TaN), titanium nitride (TiN) or a combination thereof.

The common source line CSL may be disposed in the trench TH between the stacked structures of the gate electrodes 130 adjacent to each other The gate pads 130P may correspond to a region in which the gate electrodes 130 extend horizontally from the cell region CELL to the pad region PAD. The gate pads 130P may be called word lines or word line pads as the gate electrodes 130 extend and form word lines WL1 to WLn. The gate pads 130P may extend in different lengths to have stepped portions. The gate pads 130P may provide contact regions in which lower gate pads 130P are longer than upper gate pads 130P. In the contact regions, the gate pads 130P may be connected to the second wiring lines 190 disposed thereabove through the contact plugs 180, respectively, by which an electrical signal may be applied to the gate electrodes 130.

The gate pads 130P may include regions in which thicknesses thereof are smaller than those of the gate electrodes 130, respectively. The gate pads 130P may include regions extending from the gate electrodes 130 at a certain thickness and then extending at a reduced thickness, respectively. For example, the gate pads 130P may have reduced thicknesses in the contact regions. In the entirety of the contact regions, the gate pads 130P may have a reduced thickness, for example, a second thickness T2 that is a reduced thickness from a first thickness T1 and is thinner than the first thickness T1. The gate pads 130P may have step portions CP in which the thicknesses of the gate pads 130P are vertically reduced in the contact regions, respectively.

A difference between the first thickness T1 and the second thickness T2 may be within a range of about 5 Å to about 100 Å, for example, about 10 Å to about 50 Å, and may be within a range of 1% to 35% of the first thickness T1. In the example embodiment, a difference in thicknesses between the gate pads 130P and the gate electrodes 130 connected thereto, for example, degrees of reduction in thicknesses of the gate pads 130P are substantially equal to each other.

An uppermost gate pad 137P may have a thickness lower than that of the gate electrode 137 in the pad region PAD, and a length L1 thereof extending in a reduced thickness may be variously changed according to example embodiments.

The interlayer insulating layers 120 may be arranged between the gate electrodes 130/the gate pads 130P. The interlayer insulating layers 120 may be spaced apart from each other in a direction perpendicular to an upper surface of the substrate 101 and may extend in an x direction, in a manner similar to those of the gate electrodes 130. In the pad region PAD, the interlayer insulating layers 120 may also extend in different lengths along the gate pads 130P. The interlayer insulating layers 120 may include an insulating material such as silicon oxide or silicon nitride.

The channel holes CH may be spaced apart from each other while forming rows and columns on the substrate 101 in the cell region CELL, and may be disposed so as to be shifted toward each other in an x direction. For example, the channel holes CH may be disposed to form a lattice pattern or may be disposed in a zigzag form in a single direction. The channel holes CH may have an inclined side surface tapered toward the substrate 101 according to increase in an aspect ratio thereof. The disposition of the channel holes CH may be variously changed according to example embodiments.

The channel region 140 having a pillar shape may be disposed in the channel hole CH extending in a direction perpendicular to an upper surface of the substrate 101. Although the channel region 140 within the channel hole CH may be formed in an annular shape to surround the first insulating layer 162 provided inside the channel region 140, the channel region 140 may also have a pillar shape such as a cylindrical shape or a prism shape without the first insulating layer 162 therein according to example embodiments. A lower portion of the channel region 140 may be connected to the substrate 101. The channel region 140 may include a semiconductor material such as polycrystalline silicon or monocrystalline silicon, and the semiconductor material may be a non-doped material or may be a material including a p-type impurity or an n-type impurity.

The dummy channel holes CHD may be disposed on end portions of the gate pads 130P in the pad region PAD. In an embodiment, the dummy cannel holes CHD may be disposed at both sides of the contact plugs 180 in an x direction. The dummy channel holes CHD may have the same structure as the channel holes CH. A wiring structure such as the channel plug 175 may not be disposed on upper portions of the dummy channel holes CHD.

The gate dielectric layer 150 may be disposed between the gate electrodes 130 and the channel region 140 in the channel hole CH. The gate dielectric layer 150 may extend along the channel region 140 to be perpendicular to an upper surface of the substrate 101. The gate dielectric layer 150 may include a tunneling layer, a charge storage layer, and a blocking layer sequentially stacked on the channel region 140. The gate dielectric layer 150 will be described below in further detail with reference to FIGS. 5A to 5C.

The channel pads 160 may be disposed on upper portions of the channel regions 140. The channel pads 160 may be disposed to cover an upper surface of the first insulating layer 162 and to be electrically connected to the channel region 140. The channel pad 160 may include, for example, doped polystalline silicon.

The channel plugs 175 may be penetrated through a second insulating layer 166 to be connected to the channel pads 160. The channel pads 160 may be electrically connected to the first wiring lines 170 provided thereabove by the channel plugs 175. The first wiring lines 170 may be bit lines BL1 to BLm (see FIG. 2).

The first wiring lines 170 may extend in a direction different from a direction in which the gate electrodes 130 extend, for example, in a y direction, on upper portions of the channel plugs 175.

The channel plugs 175 and the first wiring lines 170 may include a conductive material, for example, a metal such as tungsten (W), aluminum (Al), copper (Cu), or the like.

The contact plugs 180 may penetrate through the second insulating layer 166 and the pad insulating layer 129 to be connected to the gate pads 130P. As heights of the gate pads 130P are different from each other, the contact plugs 180 may have different lengths. The contact plugs 180 may be connected to the gate pads 130P, for example, in such a way that portions of the gate pads 130P are recessed. According to example embodiments, the contact plugs 180 may also have a form in which a width thereof is reduced toward a lower portion thereof due to a relatively high aspect ratio.

The second wiring lines 190 may extend in the same direction as the first wiring lines 170, for example, in a y direction, on the contact plugs 180. According to example embodiments, the gate pads 136P and 137P connected to the gate electrodes 136 and 137 of the string selection transistor SST may be connected to a separate wiring line extending in a direction different from the second wiring lines 190.

The contact plugs 180 and the second wiring lines 190 may include a conductive material, for example, a metal such as tungsten (W), aluminum (Al), copper (Cu), or the like.

Figure 5A:
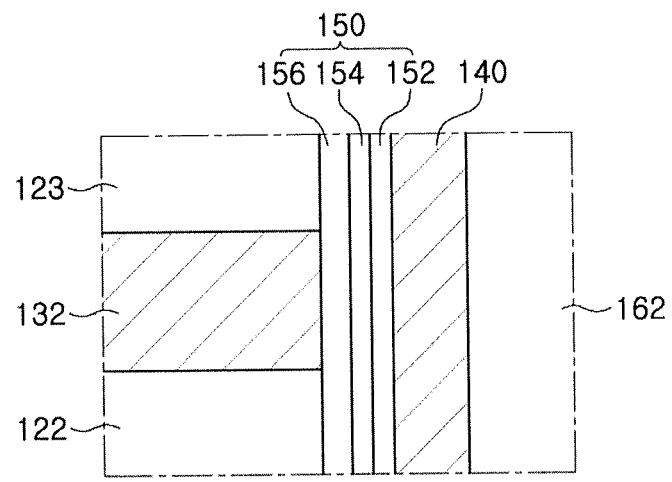
FIGS. 5A to 5C illustrate cross-sectional views of a gate dielectric layers according to example embodiments.
Figure 5B:
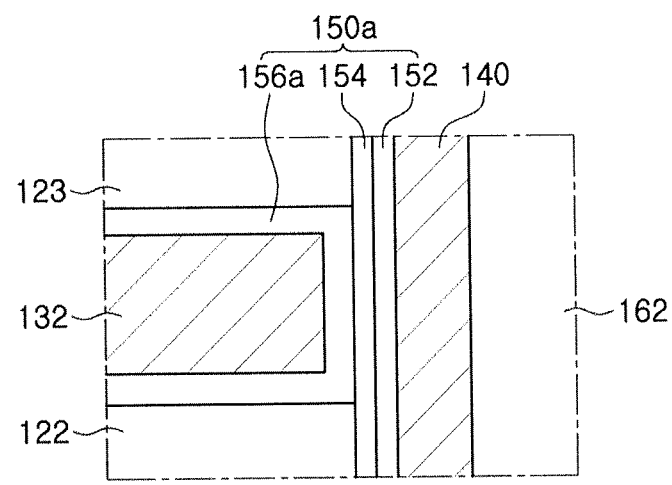
Figure 5C:
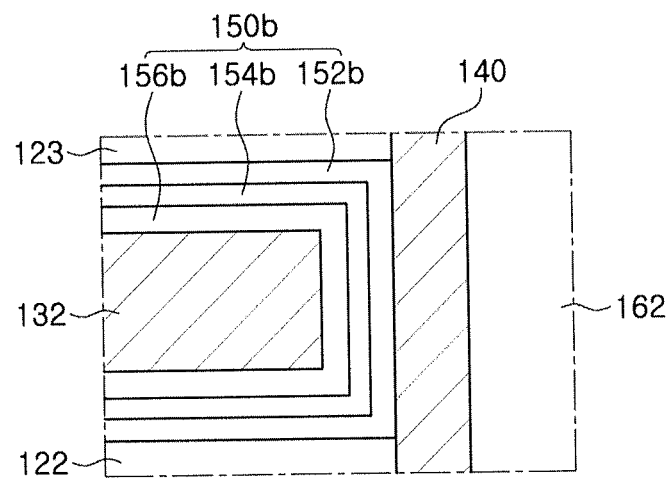

FIGS. 5A to 5C are cross-sectional views of gate dielectric layers according to example embodiments, and illustrate regions corresponding to region 'A' of FIG. 4.

With reference to FIG. 5A, a gate electrode 132, a gate dielectric layer 150 and a channel region 140 of memory cell strings are illustrated. The gate dielectric layer 150 may include a tunneling layer 152, a charge storage layer 154, and a blocking layer 156 sequentially stacked on the channel region 140.

The tunneling layer 152 may allow for tunneling of a charge to be transmitted to the charge storage layer 154 via an F-N tunneling. The tunneling layer 152 may include, for example, silicon dioxide ($SiO_2$), silicon nitride ($Si_3N_4$), silicon oxynitride (SiON), or a combination thereof.

The charge storage layer 154 may be a charge trapping layer or a floating gate conductive layer. For example, the charge storage layer 154 may include a dielectric material, quantum dots, or nanocrystals. The quantum dots or nanocrystals may be configured of a conductor, for example, a metal or semiconductor nanoparticles. In example embodiments, for example, when the charge storage layer 154 is a charge trapping layer, the charge storage layer 154 may include silicon nitride.

The blocking layer 156 may include silicon dioxide ($SiO_2$), silicon nitride ($Si_3N_4$), silicon oxynitride (SiON), a high-k dielectric material, or a combination thereof. The high-K dielectric material may be any one of $Al_2O_3$, $Ta_2O_3$, $TiO_2$, $Y_2O_3$, $ZrO_2$, $ZrSi_xO_y$, $HfO_2$, $HfSi_xO_y$, $La_2O_3$, $LaAl_xO_y$, $LaHf_xO_y$, $HfAl_xO_y$, and $Pr_2O_3$.

With reference to FIG. 5B, a gate electrode 132, a gate dielectric layer 150a and a channel region 140 of memory cell strings are illustrated. The gate dielectric layer 150a may have a structure in which a tunneling layer 152, a charge storage layer 154, and a blocking layer 156 are sequentially stacked on the channel region 140. Relative thicknesses of the layers above forming the gate dielectric layer 150a may be variously changed.

In detail, in the gate dielectric layer 150a according to the example embodiment, the tunneling layer 152 and the charge storage layer 154 may extend vertically along the channel region 140, while the blocking layer 156a may be disposed to encompass the gate electrode layer 132 in a manner different from the example embodiment of the FIG. 5A. In example embodiments, a portion of the blocking layer 156a may extend vertically along the channel region 140, and a portion thereof may be disposed to encompass the gate electrode layer 132.

With reference to FIG. 5C, a gate electrode 132, a gate dielectric layer 150b and a channel region 140 of memory cell strings are illustrated. The gate dielectric layer 150b may have a structure in which a tunneling layer 152b, a charge storage layer 154b, and a blocking layer 145b are sequentially stacked on the channel region 140.

Figure 6A:
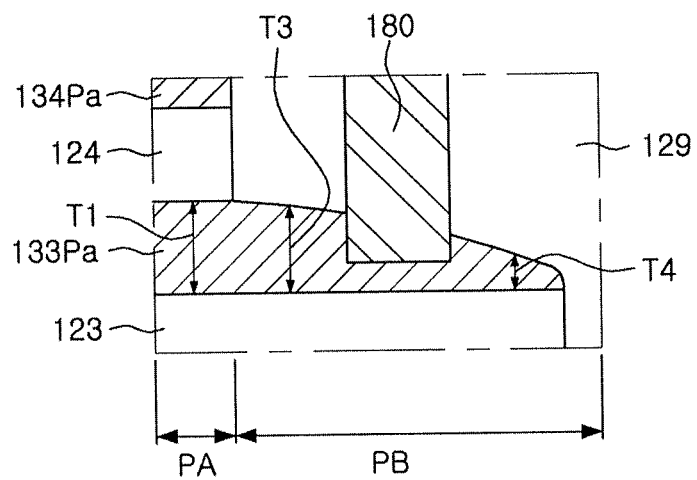
FIGS. 6A to 6C illustrate cross-sectional views of gate pads according to example embodiments.
Figure 6B:
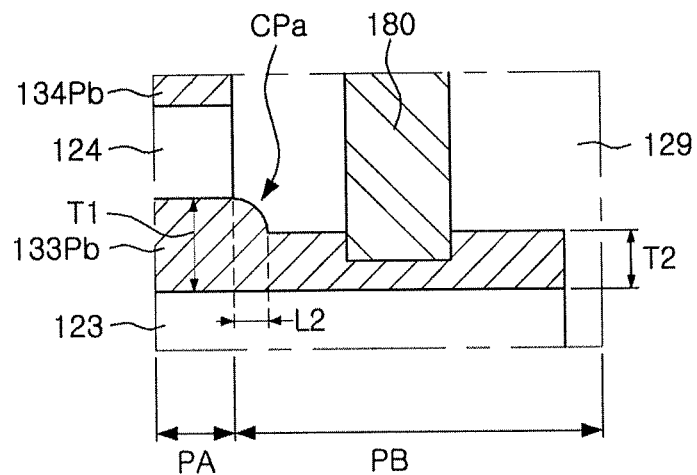
Figure 6C:
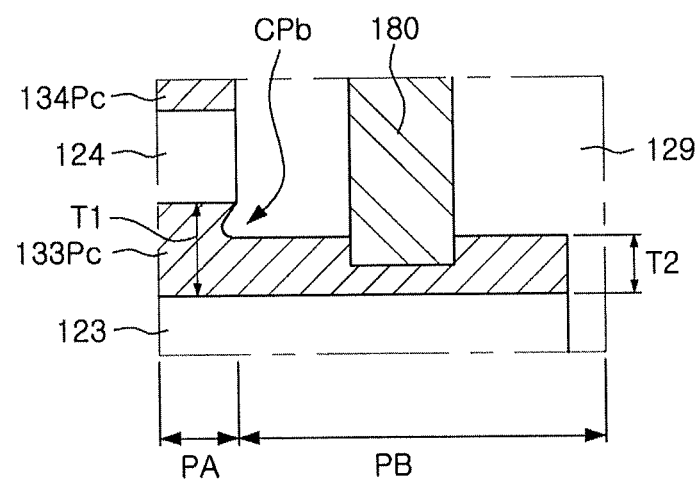

In detail, in the gate dielectric layer 150b according to the example embodiment, all of the tunneling layer 152b, the charge storage layer 154b, and the blocking layer 156b may be disposed to encompass the gate electrode layer 132, in a manner different from the example embodiments of the FIGS. 5A and 5B. example embodiment FIGS. 6A to 6C are cross-sectional views of gate pads according to example embodiments and illustrate regions corresponding to region 'B' of FIG. 4.

With reference to FIG. 6A, a gate pad 133Pa and a contact plug 180 are illustrated. The gate pad 133Pa may include an extension region PA extending while being connected to the gate electrode 133, and a contact region PB extending to be longer than an upper gate pad 134Pa and be connected to the contact plug 180.

The gate pad 133Pa according to the example embodiment may have a thickness gradually or continuously reduced in the contact region PB in a manner different from the example embodiment of FIG. 4. When a thickness of the gate electrode 133 and the gate pad 133Pa in the extension region PA is the first thickness T1, the thickness of the gate pad 133Pa may have a third thickness T3 lower than the first thickness T1 in the contact region PB adjacent to the connection region PA, and may have a fourth thickness T4 lower than the third thickness T3 in a region near an end of the contact region PB.

With reference to FIG. 6B, a gate pad 133Pb may have a curved portion CPa in which a thickness thereof is rapidly or discontinuously reduced in the contact region PB adjacent to the extension region PA in a manner different from the example embodiment of FIG. 4. By the curved portion CPa, a thickness of the gate pad 133Pb may be reduced from the first thickness T1 to the second thickness T2 in a region in which the curved portion CPa is formed, and the gate pad 133Pb may extend by the second thickness T2 so as to have a flat upper surface, e.g., parallel to the substrate 101, in a region except the region in which the curved portion CPa is formed. A length L2 of the curved portion CPa may be variously changed according to example embodiments.

With reference to FIG. 6C, a gate pad 133Pc may have a recess-shaped curved portion CPb in the extension region PA adjacent to the contact region PB in a manner different from the example embodiments of FIGS. 4 and 6B. A position, the recessed form, and depth of the curved portion CPb, for example, may be variously changed according to example embodiments. By the curved portion CPb, a thickness of the gate pad 133Pc may be reduced from the first thickness T1 to the second thickness T2 in a region in which the curved portion CPb is formed, and the gate pad 133Pc may extend by the second thickness T2 so as to have a flat upper surface, e.g., parallel to the substrate 101, in a region thereof except the region in which the curved portion CPb is formed.

Figure 7:
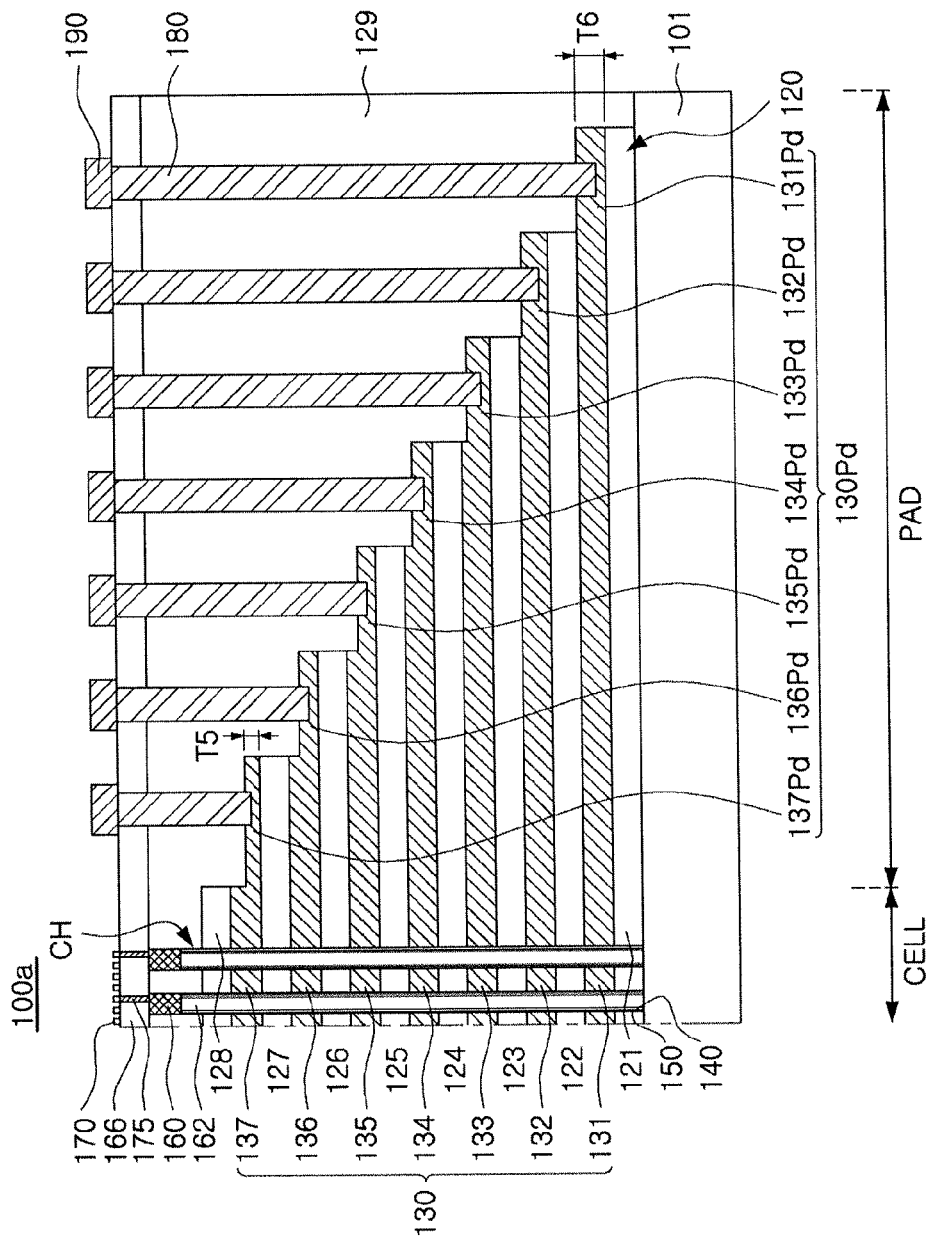
FIGS. 7 to 9 illustrate schematic cross-sectional views of semiconductor devices according to example embodiments.
Figure 8:
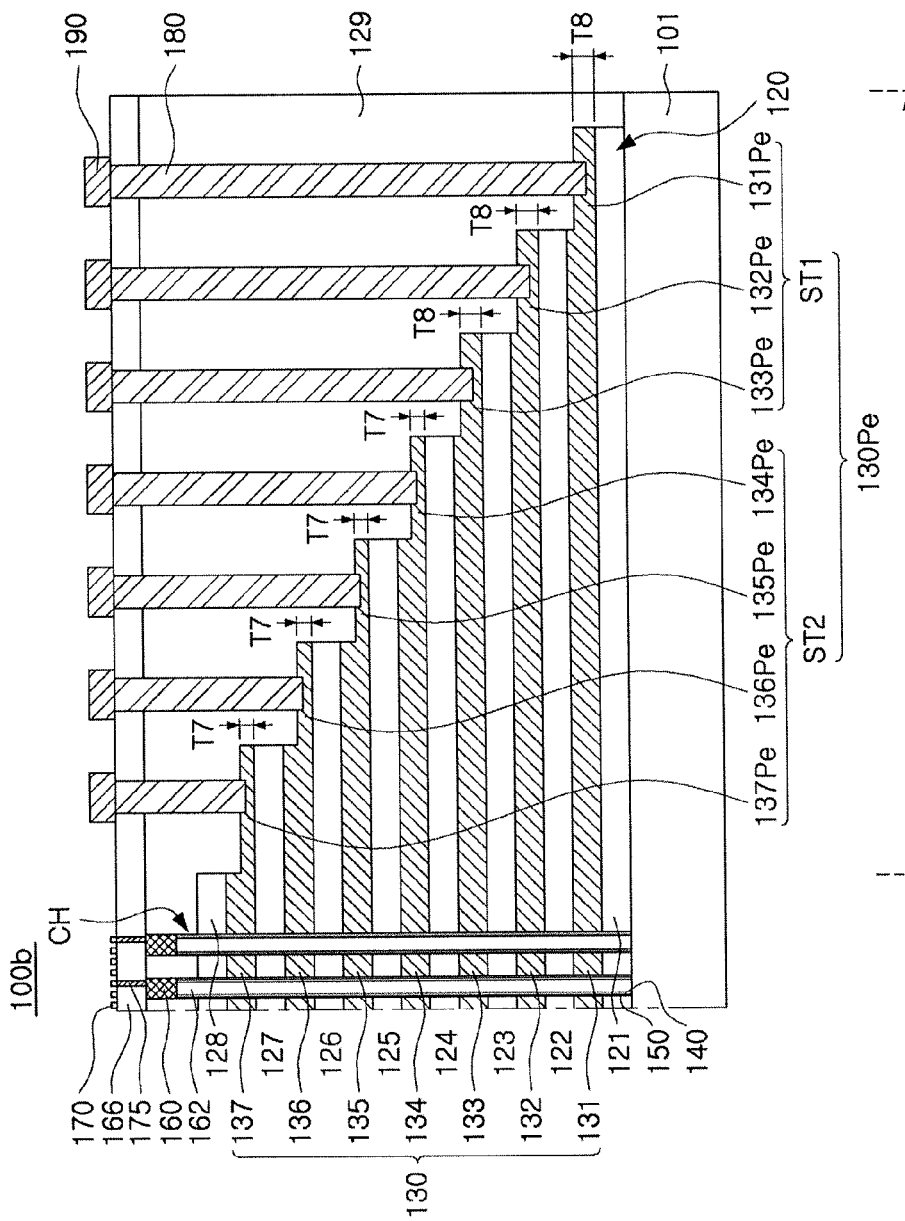
Figure 9:
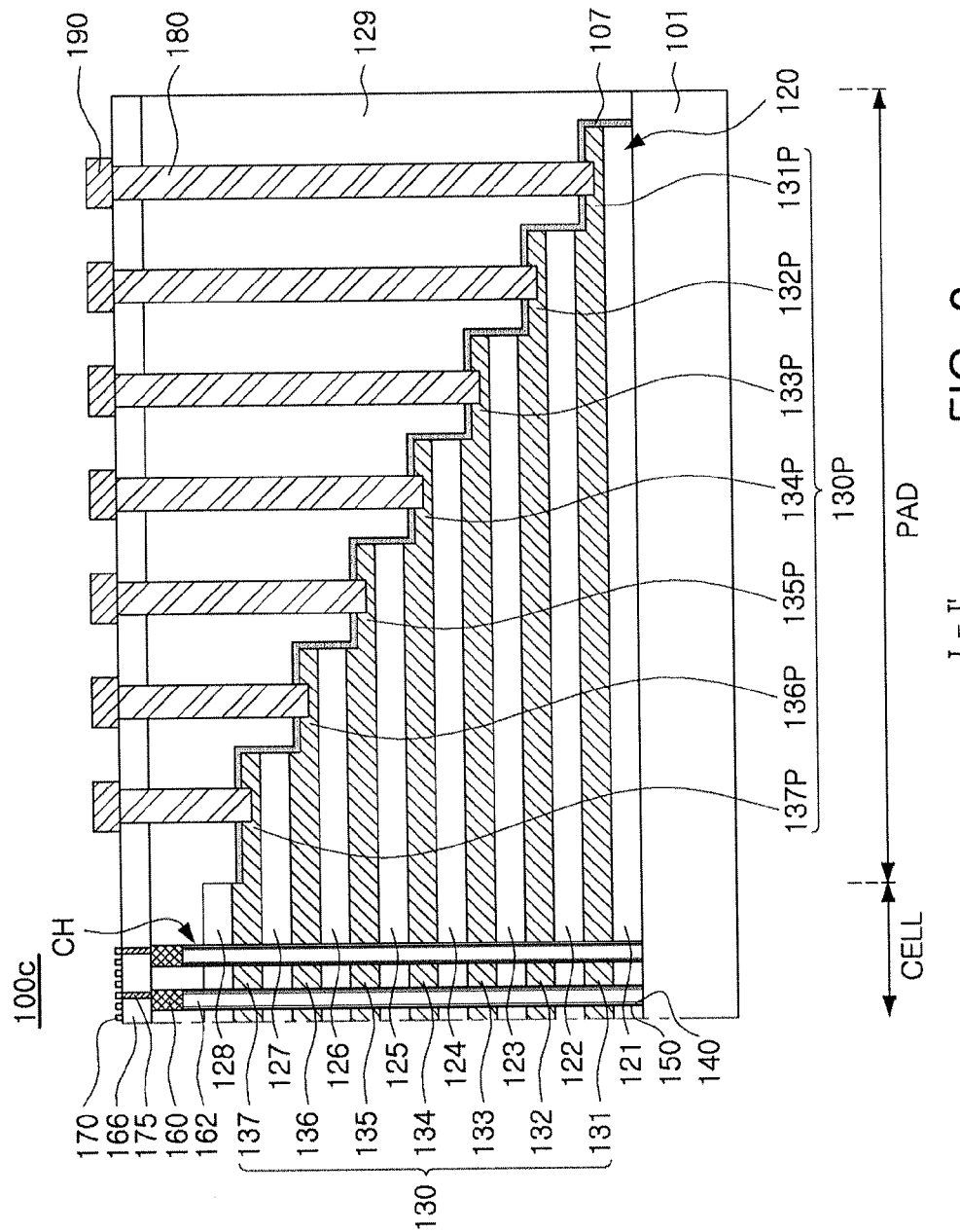

FIGS. 7 to 9 are schematic cross-sectional views of semiconductor devices according to example embodiments.

With reference to FIG. 7, a semiconductor device 100a may include gate electrodes 130, interlayer insulating layers 120, channel holes CH, gate pads 130Pd extending horizontally from the gate electrodes 130, and contact plugs 180 connected to the gate pads 130Pd.

The gate pads 130Pd may include regions in which the gate pads extend from the gate electrodes 130 at a certain thickness and then extend by a reduced thickness, respectively. For example, lower gate pads 130Pd may have contact regions extending to be longer than those of upper gate pads 130Pd so as to be connected to the contact plugs 180 and may have thicknesses reduced in the contact regions, respectively.

The gate pads 130Pd may have thicknesses that are further reduced away from an upper surface of the substrate 101 in a manner different from the example embodiment of FIG. 4. For example, a degree of reduction in thicknesses of upper gate pads 130Pd may be greater than that in thicknesses of lower gate pads 130Pd. For example, when the thicknesses of the gate electrodes 130 are substantially the same as each other, an uppermost gate pad 137Pd may have a fifth thickness T5 in the contact region, and a lowermost gate pad 131Pd may have a sixth thickness T6 thicker than the fifth thickness T5 in the contact region. The sixth thickness T6 may be equal to or lower than that of the gate electrode 131 connected to the gate pad 131Pd.

According to example embodiments, the degree of reduction in thicknesses of the gate pads 130Pd may also be reduced away from an upper surface of the substrate 101 on the contrary to the tendency for reduction of thickness in the example embodiment. For example, the degree of reduction in thicknesses of lower gate pads 130Pd may be greater than that in thicknesses of upper gate pads 130Pd. The tendency for a difference in reduction of thicknesses between the gate pads 130Pd may be determined on a formation sequence during a manufacturing process, and may be proportional or inversely proportional to a distance thereof from the substrate 101.

With reference to FIG. 8, a semiconductor device 100b may include gate electrodes 130, interlayer insulating layers 120, channel holes CH, gate pads 130Pe extending horizontally from the gate electrodes 130, and contact plugs 180 connected to the gate pads 130Pe.

The gate pads 130Pe may include regions extending from the gate electrodes 130 at a certain thickness and then extending at a reduced thickness, respectively. For example, lower gate pads 130Pe may have contact regions in which lower gate pads 130Pe extend longer than upper gate pads 130Pe, so as to be connected to the contact plugs 180, respectively, and the contact regions thereof may have relatively reduced thicknesses, respectively.

The gate pads 130Pe may be divided into a first group ST1 and a second group ST2 which are respectively disposed at relatively high and low positions. The first group ST1 may include lower gate pads 131Pe, 132Pe and 133Pe, and the second group ST2 may include upper gate pads 134Pe, 135Pe, 136Pe and 137Pe.

Degrees of reduction in thicknesses of the gate pads 130Pe may be different from each other in the first and second groups ST1 and ST2. For example, the degree of reduction in thicknesses in the second group ST2 may be greater than the degree of reduction in thicknesses in the first group ST1. For example, when the thicknesses of the gate electrodes 130 are substantially the same as each other, the second group ST2 may have a seventh thickness T7 in the respective contact region, and the first group ST1 may have an eighth thickness T8 greater than the seventh thickness T7 in the respective contact region. According to example embodiments, when the thicknesses of the gate electrodes 130 are different from each other, only the degrees of reduction in thicknesses of the gate pads 130Pes may be the same as each other in each of the first and second groups ST1 and ST2.

The classification of the groups such as the first and second groups ST1 and ST2 may be variously changed according to example embodiments. For example, the number of groups and the number of gate pads 130Pe included in a single group may be variously changed. According to example embodiments, the degree of reduction in thicknesses may be relatively small in the group disposed at relatively high positions, to the contrary to the tendency for reduction of thicknesses in the present example embodiment. Such a difference in the degrees of reduction in thicknesses between the gate pads 130Pd in respective groups may be determined depending on a formation sequence and a formation method, and the like, during a manufacturing process.

With reference to FIG. 9, a semiconductor device 100c may include gate electrodes 130, interlayer insulating layers 120, channel holes CH, gate pads 130P extending horizontally from the gate electrodes 130, contact plugs 180 connected to the gate pads 130P, and an etch-stop layer 107 on the gate pads 130P.

The etch-stop layer 107 may be disposed on step portions having a step shape formed by the gate pads 130P. The etch-stop layer 107 may be disposed on a region in which the gate pads 130P are connected to the contact plugs 180, and the contact plugs 180 may penetrate through the etch-stop layer 107 to be connected to the gate pads 130P.

The etch-stop layer 107 may serve to stop etching such that holes having different depths may be stably formed when the holes for the formation of the contact plugs 180 are formed. The etch-stop layer 107 may include a material different from those of a pad insulating layer 129 and the gate pads 130P so as to have different etching selectivity therewith. For example, when the pad insulating layer 129 includes silicon oxide and the gate pads 130P include a metal, the etch-stop layer 107 may include silicon nitride or silicon carbide.

According to example embodiments, the etch-stop layer 107 may not be in direct contact with the gate pads 130P, but may be spaced apart from the gate pads 130P at a predetermined height to be disposed within the pad insulating layer 129. The etch-stop layer 107 may include a conductive material such as polycrystalline silicon.

FIGS. 10A to 10K schematically illustrate drawings of principal processes of a method of manufacturing a semiconductor device according to an example embodiment. FIGS. 10A to 10K illustrate a method of manufacturing the semiconductor device 100 of FIGS. 3 and 4.

Figure 10A:
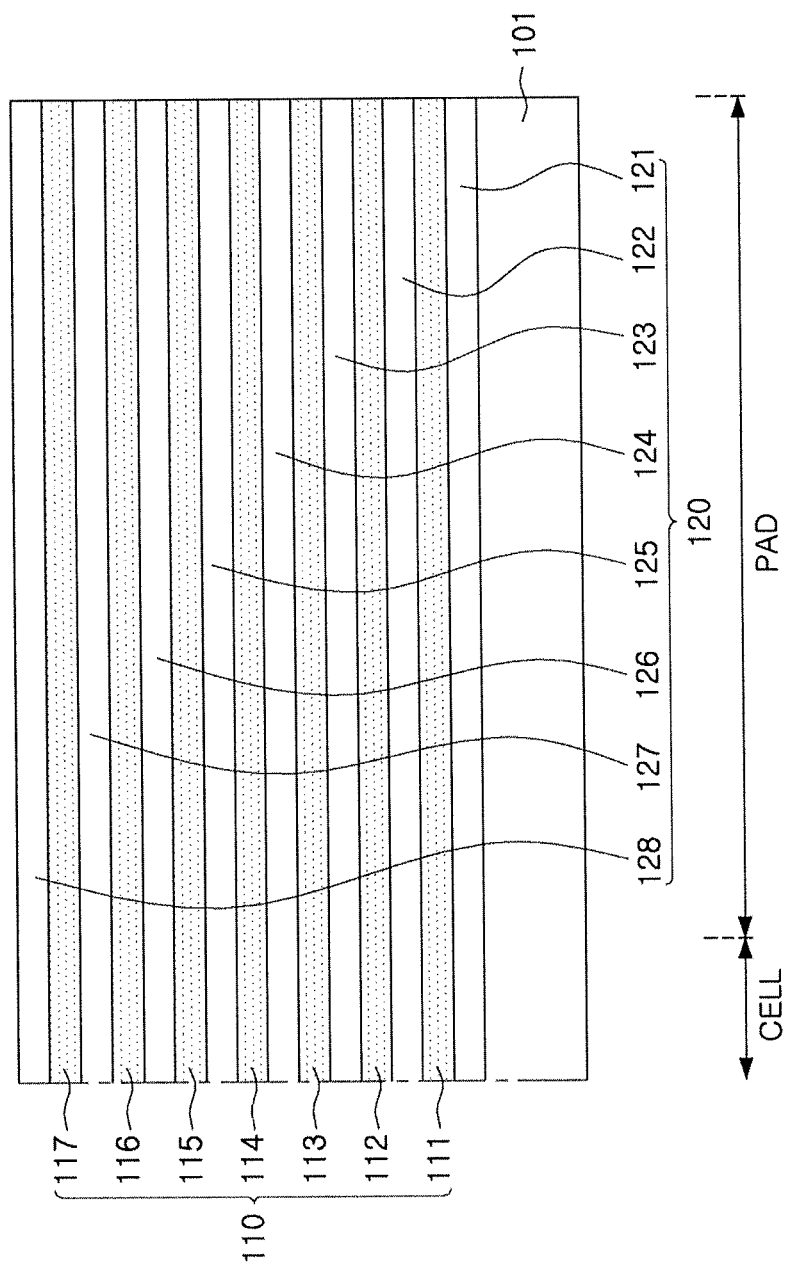

With reference to FIG. 10A, sacrificial layers 110, for example, layers 111 to 117, and interlayer insulating layers 120, for example, layers 121 to 128, may be alternately stacked on a substrate 101. The sacrificial layers 110 may be replaced by the gate electrodes 130 through a subsequent process.

An interlayer insulating layer 121 may first be formed, and then, the sacrificial layers 110 and the interlayer insulating layers 120 may be alternately stacked on the substrate 101 as illustrated in FIG. 10A. The sacrificial layers 110 may include a material capable of being selectively etched with the interlayer insulating layers 120. For example, the sacrificial layers 110 may be formed of a material that may be etched with significantly reducing etching of the interlayer insulating layers 120 during a process of etching the sacrificial layers 110. Such etching selectivity or etching selection ratio may be quantitatively represented via an etching speed ratio of the sacrificial layers 110 with respect to an etching speed of the interlayer insulating layer 120. For example, the interlayer insulating layer 120 may include at least one of silicon oxide and silicon nitride, and the sacrificial layers 110 may include a material different from that of the interlayer insulating layer 120, for example, a material selected from silicon, silicon oxide, silicon carbide, and silicon nitride.

According to example embodiments, thicknesses of the interlayer insulating layers 120 may not be the same as each other. For example, a lowermost interlayer insulating layer 121 among the interlayer insulating layers 120 may have a relatively thin thickness, and an uppermost interlayer insulating layer 128 may have a relatively thick thickness. In example embodiments, interlayer insulating layers 122 and 126 disposed between the ground selection transistors GST and the memory cells MC1 to MCn of FIG. 2 and between the string selection transistors SST and the memory cells MC1 to MCn of FIG. 2 may have a thickness greater than those of interlayer insulating layers 123 to 125 disposed between the memory cells MC1 to MCn. The thicknesses of the interlayer insulating layers 120 and the sacrificial layers 110 may be variously changed. The number of layers configuring the interlayer insulating layers 120 and the sacrificial layers 110 may also be variously changed.

With reference to FIG. 10B, a hard mask layer HM and a first photomask layer PM1 may be formed on the interlayer insulating layers 120 and the sacrificial layers 110 stacked on one another, and portions of the sacrificial layers 110 and the interlayer insulating layers 120 may be removed using the hard mask layer HM and the first photomask layer PM1.

In order to form gate pads 130P having step portions in the pad region PAD as illustrated in FIG. 4, a process of removing portions of the sacrificial layers 110 may be performed. First, the hard mask layer HM may be formed on the interlayer insulating layers 120 and the sacrificial layers 110 in the cell region CELL to protect the cell region CELL. The hard mask layer HM may include a material different from that of the interlayer insulating layer 120, and may also be consist of a multiple layer.

Next, the first photomask layer PM1 may be formed to remove a portion of an uppermost seventh sacrificial layer 117. The first photomask layer PM1 may be formed to correspond to a desired length of the seventh sacrificial layer 117, for example, a desired length of the gate pad 137P (see FIG. 4). Portions of the interlayer insulating layers 120 and the sacrificial layers 110 exposed by the first photomask layer PM1 may be removed using dry etching or wet etching.

Figure 10C:
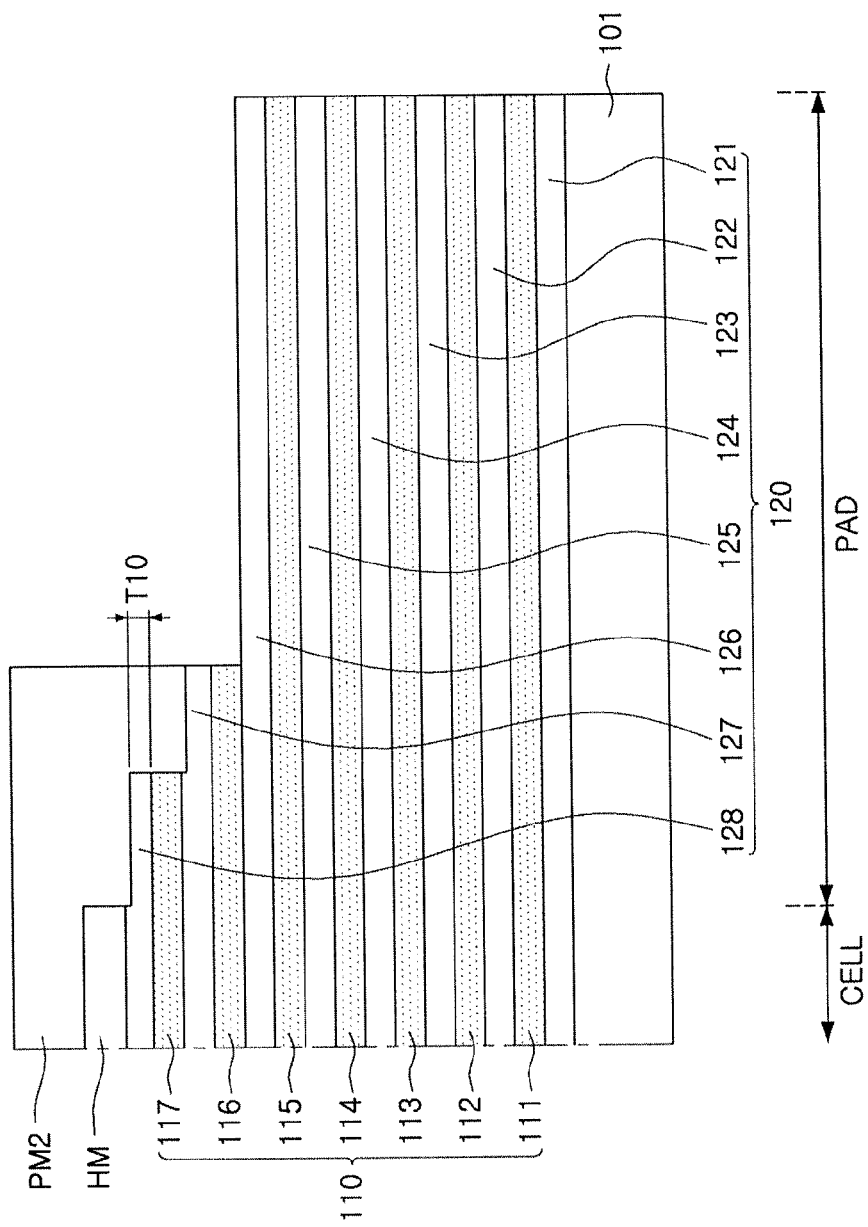

With reference to FIG. 10C, a second photomask layer PM2 may be formed after removing the first photomask layer PM1, and portions of the interlayer insulating layers 120 and the sacrificial layers 110 may be removed using the second photomask layer PM2.

First, the first photomask layer PM1 may be removed by ashing and stripping processes. Portions of the interlayer insulating layers 127 and 128 exposed during the stripping process may also be removed. For example, when the interlayer insulating layers 120 include silicon oxide and the stripping process is performed using hydrogen fluoride (HF), a thickness of an uppermost interlayer insulating layer 128 may be reduced from a ninth thickness T9 (see FIG. 10B) to a tenth thickness T10 lower than the ninth thickness T9.

Subsequently, the second photomask layer PM2 may be formed to remove a portion of a sixth sacrificial layer 116. Portions of the interlayer insulating layers 120 and the sacrificial layers 110 exposed by the second photomask layer PM2 may be removed using dry etching or wet etching.

Figure 10D:
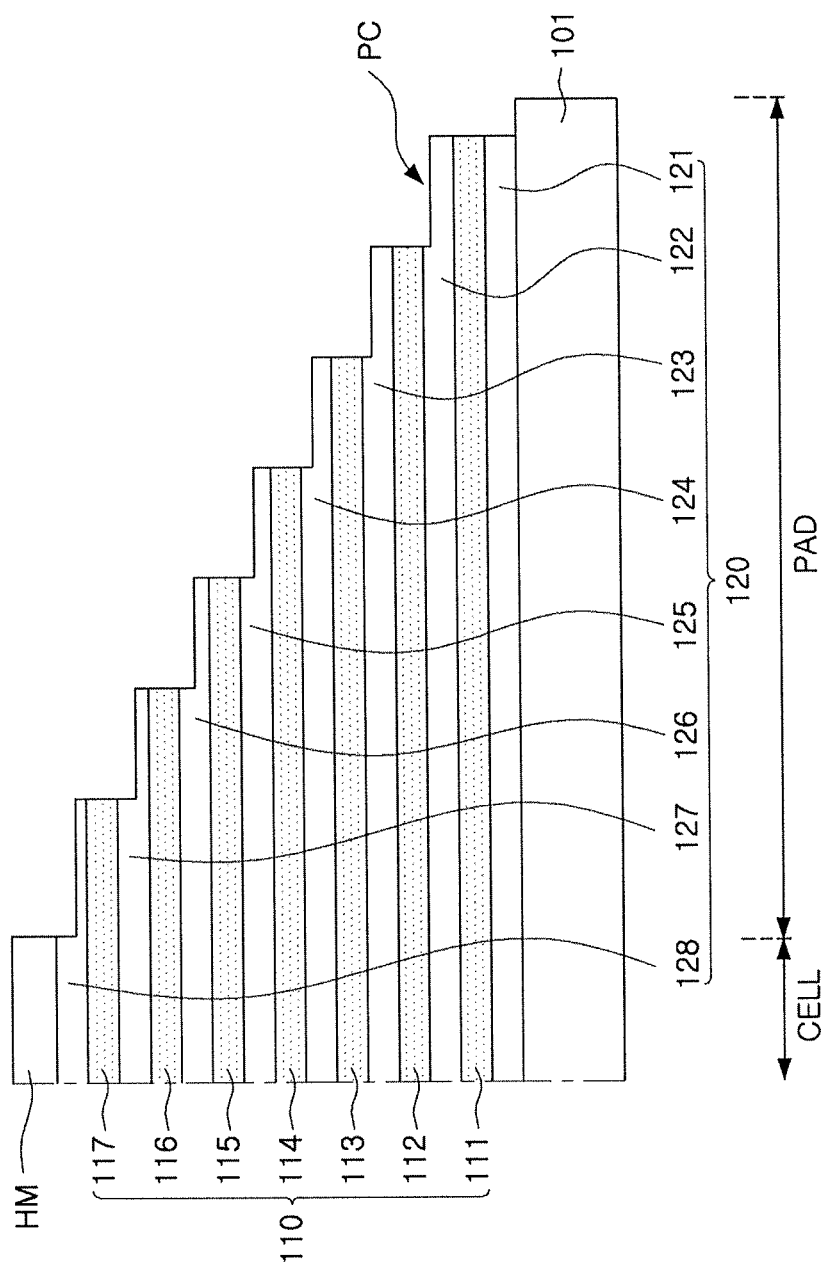

With reference to FIG. 10D, all of the sacrificial layers 110 may be subjected to a cutting process to have different lengths.

As described above referring to FIGS. 10B and 10C, the formation of the photomask layers PM1 and PM2, the removal of portions of the interlayer insulating layers 120 and the sacrificial layers 110, and the removal of the photomask layers PM1 and PM2 may be repetitively performed, such that portions of all of the sacrificial layers 110 may be removed by a cutting process to have stepped portions.

In such repeated processes, the interlayer insulating layers 120 may also be partially removed when the photomask layers PM1 and PM2 are removed, as described above with reference to FIG. 10C. The interlayer insulating layers 120 may have reduced thicknesses in exposure regions PC thereof, respectively. Upper interlayer insulating layers 120 exposed more frequently in the stripping process may have a thickness more reduced than those of lower interlayer insulating layers 120. The reduction in thicknesses of the interlayer insulating layers 120 may be variously changed according to example embodiments. For example, a portion of the interlayer insulating layers 120 may be completely removed in the exposure region PC thereof so as not to be remaining. Lower sacrificial layers 110 may be exposed.

The example embodiment illustrates a method of removing portions of the sacrificial layers 110 in sequence from an upper portion to a lower portion thereof. The cutting process thereof performed in sequence from a lower portion to an upper portion may also be used. The lower interlayer insulating layers 120 may have thicknesses more reduced than those of upper interlayer insulating layers in the exposure regions PC, respectively.

Figure 10E:
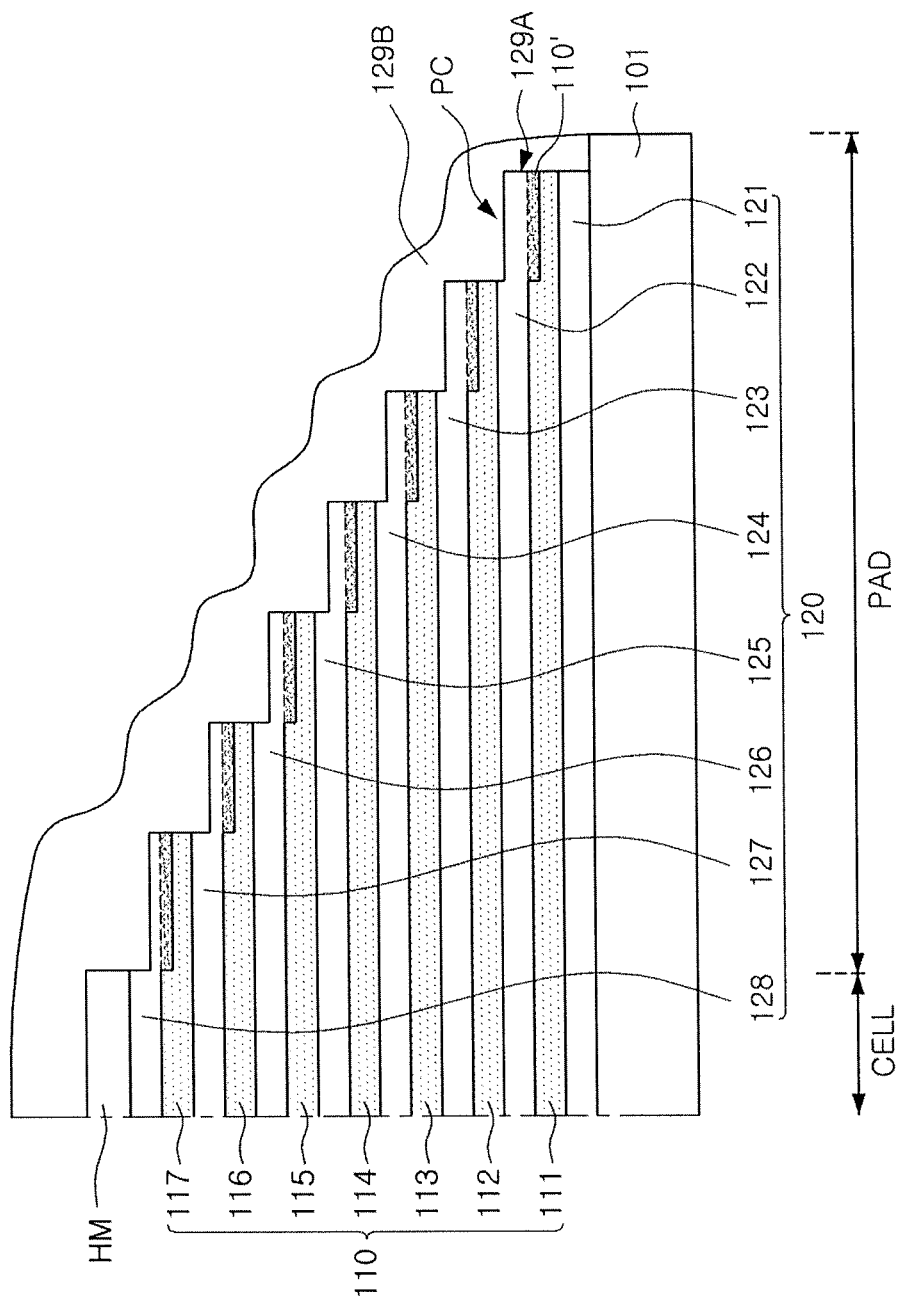

With reference to FIG. 10E, first and second pad insulating layers 129A and 129B may be formed.

The second pad insulating layer 129B may include an oxide-based material, and for example, may be a layer formed using HDP (high density plasma). In the exposure regions PC, the sacrificial layers 110 disposed below relatively thin interlayer insulating layers 120 may be partially oxidized by oxide source provided when the second pad insulating layer 129B is formed, thereby forming the oxidized layers 110'. In the exposure regions PC, thicknesses of the interlayer insulating layers 120 disposed on the sacrificial layers 110 may be reduced, and the sacrificial layers 110 may not be protected such that at least portions of the sacrificial layers 110 may be oxidized by a predetermined depth from an upper surface thereof.

In FIG. 10E, the first pad insulating layers 129A are illustrated as a combination of two layers including oxide layers 110' formed by oxidized sacrificial layers 110, and interlayer insulating layers 120 remained on upper portions of the sacrificial layers 110 in the exposure regions PC, respectively. The two layers may, for example, not be discernible from each other.

For example, when the thicknesses of the interlayer insulating layers 120 remained in the exposure regions PC are relatively thin so as not to prevent oxidization of the sacrificial layers 110, the thicknesses of the oxide layers 110' may be substantially the same as or similar to each other regardless of remained thicknesses of the interlayer insulating layers 120 as illustrated in the present example embodiment. In example embodiments as in FIG. 7, thicknesses of the oxide layers 110' formed by oxidizing the sacrificial layers 110 may be changed depending on thicknesses of remained interlayer insulating layers 120. For example, when remained thicknesses of the interlayer insulating layers 120 in a lower portion of the stacked interlayer insulating layers 120 are relatively thick, the oxide layers 110' may be relatively thick in an upper portion of the stacked interlayer insulating layers 120. In example embodiments as described above with reference to FIGS. 6A to 6C, a shape of the gate pad layers 133Pa, 133Pb, and 133Pc may also be determined depending on a shape of the oxide layers 110' at this stage.

According to example embodiments, a semiconductor device may be manufactured by directly stacking the interlayer insulating layers 120 and the gate electrodes 130/the gate pads 130P (see FIG. 4) on each other, without using a stacked structure of the sacrificial layers 110 and the interlayer insulating layers 120. A cutting process on the gate pads 130P may be performed instead of using a cutting process on the sacrificial layers 110.

At this stage, when the second pad insulating layer 129B is formed, the gate pads 130P may be partially oxidized in the exposure regions PC to form oxide layers 110', respectively, and a structure as illustrated in FIG. 4 may be formed.

Figure 10F:
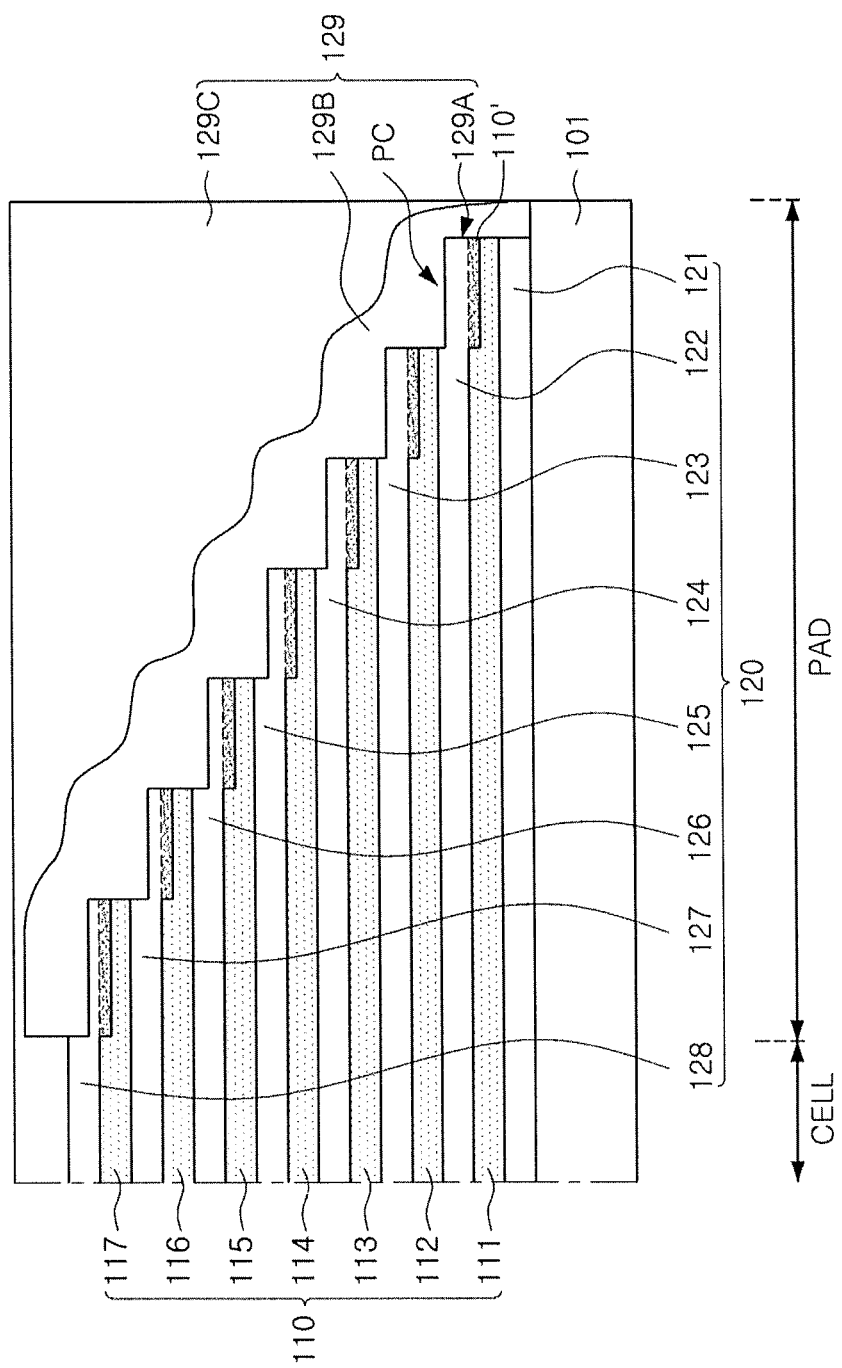

With reference to FIG. 10F, a pad insulating layer 129 covering the pad region PAD may be formed by forming a third pad insulating layer 129C.

First, after a portion of the third pad insulating layer 129C is formed, a planarization process may be performed to allow a hard mask layer HM to be exposed. The third pad insulating layer 129C may be, for example, a tetra-ethyl-ortho-silicate (TEOS) layer.

Next, after the hard mask layer HM is selectively removed, an insulating material may additionally be deposited thereon to form the third pad insulating layer 129C. A formation method and a process sequence of the third pad insulating layer 129C may be various. Whereby, the pad insulating layer 129 including the first to third pad insulating layers 129A, 129B, and 129C may be formed. The first to third pad insulating layers 129A, 129B, and 129C configuring the pad insulating layer 129 may include the same material, and boundaries therebetween may not be discerned. The first to third pad insulating layers 129A, 129B, and 129C will be illustrated as a single layer below.

Figure 10G:
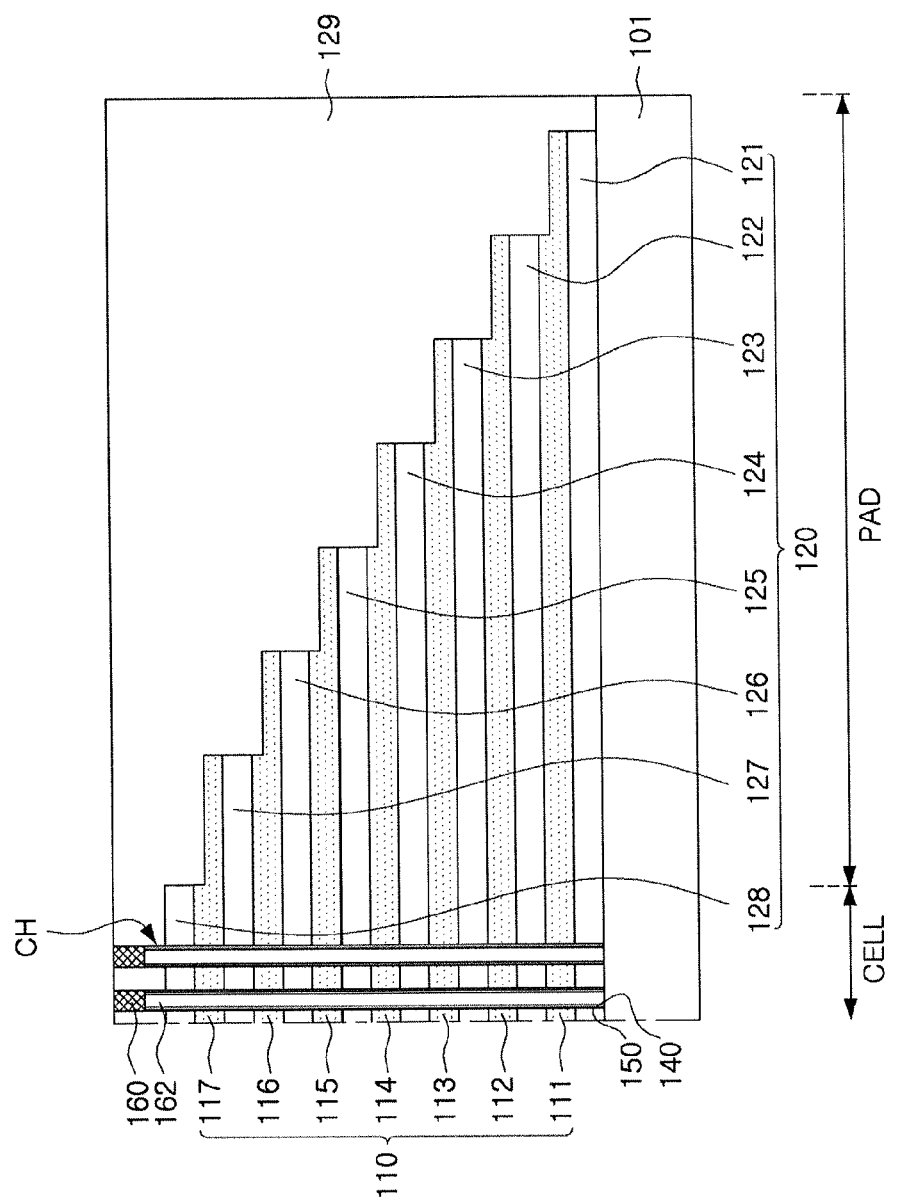

With reference to FIG. 10G, the channel holes CH and the dummy channel holes CHD (see FIG. 3) may be formed.

First, the channel holes CH may be formed by anisotropically etching the sacrificial layers 110 and the interlayer insulating layers 120. A stacked structure including different types of layers may be etched, and sidewalls of the channel holes CH may not be perpendicular to an upper surface of the substrate 101. For example, according to example embodiments, widths of the channel holes CH may be reduced toward an upper surface of the substrate 101. According to example embodiments, a portion of the substrate 101 may be recessed by the channel holes CH.

Subsequently, a gate dielectric layer 150, a channel region 140, a first insulating layer 162, and channel pads 160 may be formed within the channel holes CH. The dummy channel holes CHD of the pad region PAD may also have the same structure as that of the channel holes CH.

The gate dielectric layer 150 may be formed to have a uniform thickness through atomic layer deposition (ALD) or chemical vapor deposition (CVD). In the present process, the gate dielectric layer 150 may overall or partially be formed, and a portion thereof extending along a length of the channel hole CH to be perpendicular to an upper surface of the substrate 101 may be formed in the present process. The channel region 140 may be formed on the gate dielectric layer 150 within the channel holes CH.

The first insulating layers 162 may fill the first channel holes CH, and may include an insulating material. According to some embodiments, a conductive material instead of the first insulating layer 162 may also fill a gap between the channel regions 140. The channel pad 160 may include a conductive material. The channel pad 160 may include, for example, polycrystalline silicon.

Figure 10H:
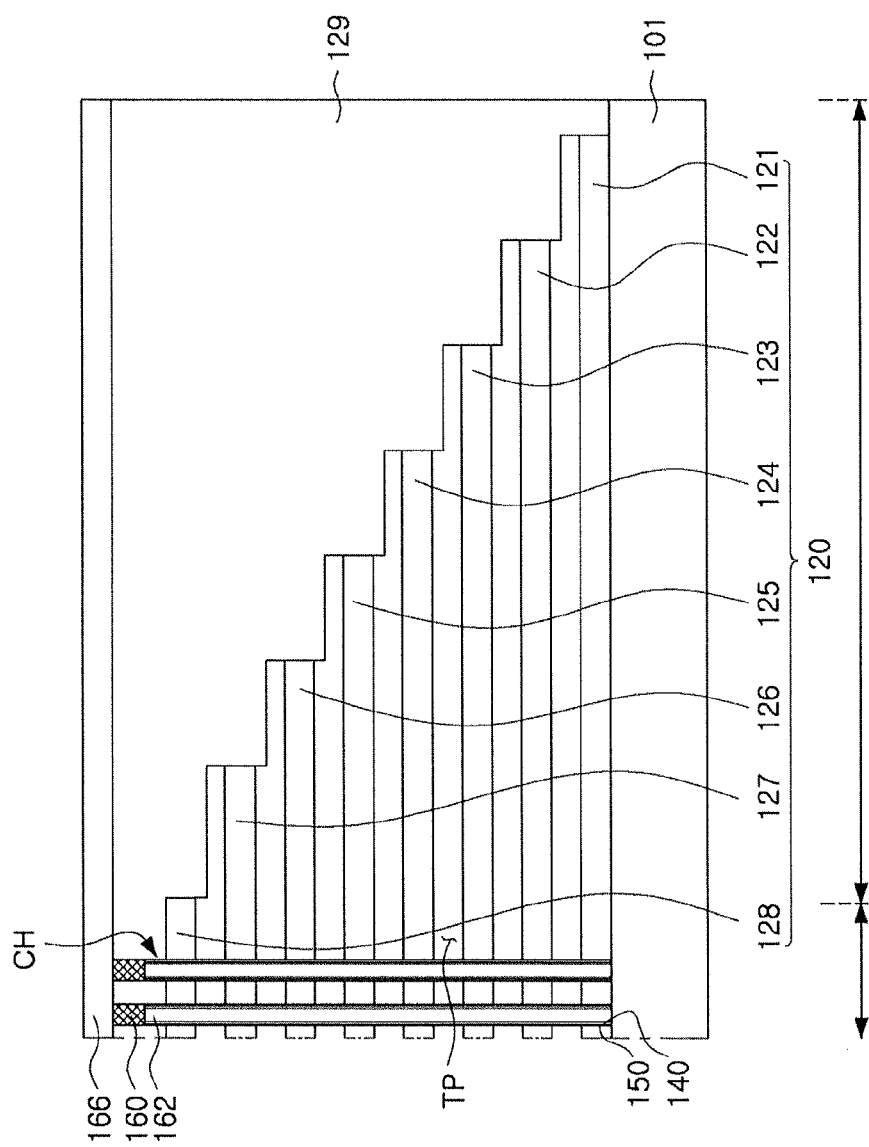

With reference to FIG. 10H, a trench TH (see FIG. 3) may be formed to allow the stacked structures in which the sacrificial layers 110 and the interlayer insulating layers 120 are stacked to be separated from each other in a direction not illustrated in the drawings, and the sacrificial layers 110 exposed through the trench TH may be removed.

The sacrificial layers 110 may be selectively removed with the interlayer insulating layers 120, for example, using wet etching, to form a tunnel portion TP. Before removing the sacrificial layers 110, a second insulating layer 166 may further be formed on the channel pads 160 to protect the channel holes CH.

In this process, portions of the sacrificial layers 110 forming a portion of the first pad insulating layer 129A (see FIG. 10F) by oxidization may not be removed, and the tunnel portion TP may have a reduced width at an end thereof.

Figure 10I:
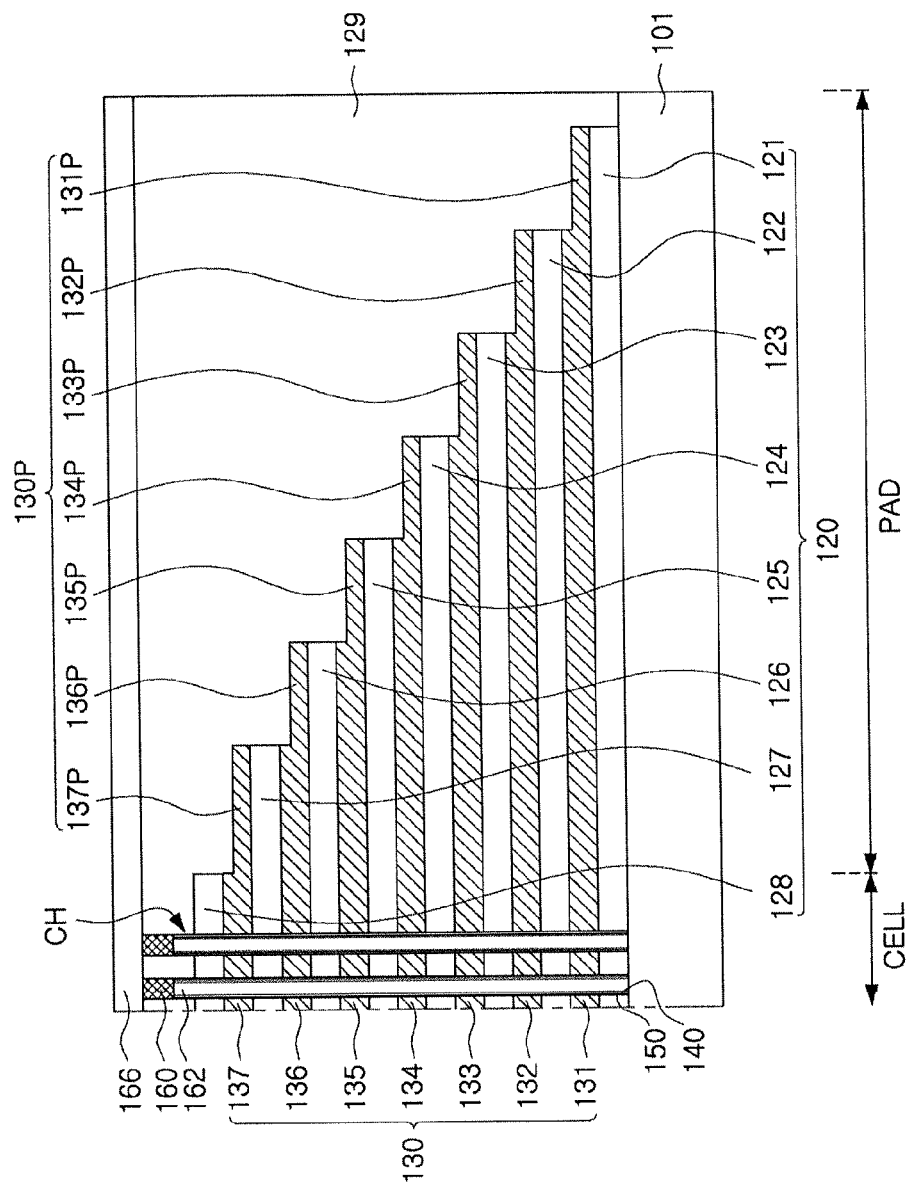

With reference to FIG. 10I, gate electrodes 130 and gate pads 130P may be formed by filling regions from which the sacrificial layers 110 are removed, with a conductive material.

The gate electrodes 130 and the gate pads 130P may include a metal, polycrystalline silicon, or a metal silicide material. The metal silicide material may be a silicide material of a metal selected from among, for example, cobalt (Co), nickel (Ni), hafnium (Hf), platinum (Pt), tungsten (W) and titanium (Ti), or a combination thereof. For example, when the gate electrodes 130 and the gate pads 130P include a metal silicide material, silicon (Si) may fill the tunnel portions TP and an additional metal layer may then be formed to be subjected to a silicidizing process, thereby forming the gate electrodes 130 and the gate pads 130P.

After the gate electrodes 130 and the gate pads 130P are formed, a material forming the gate electrodes 130 formed in the trench TH (see FIG. 3) may be removed by an additional process. Next, a common source line CSL (see FIG. 2) may be formed in the trench TH.

Figure 10J:
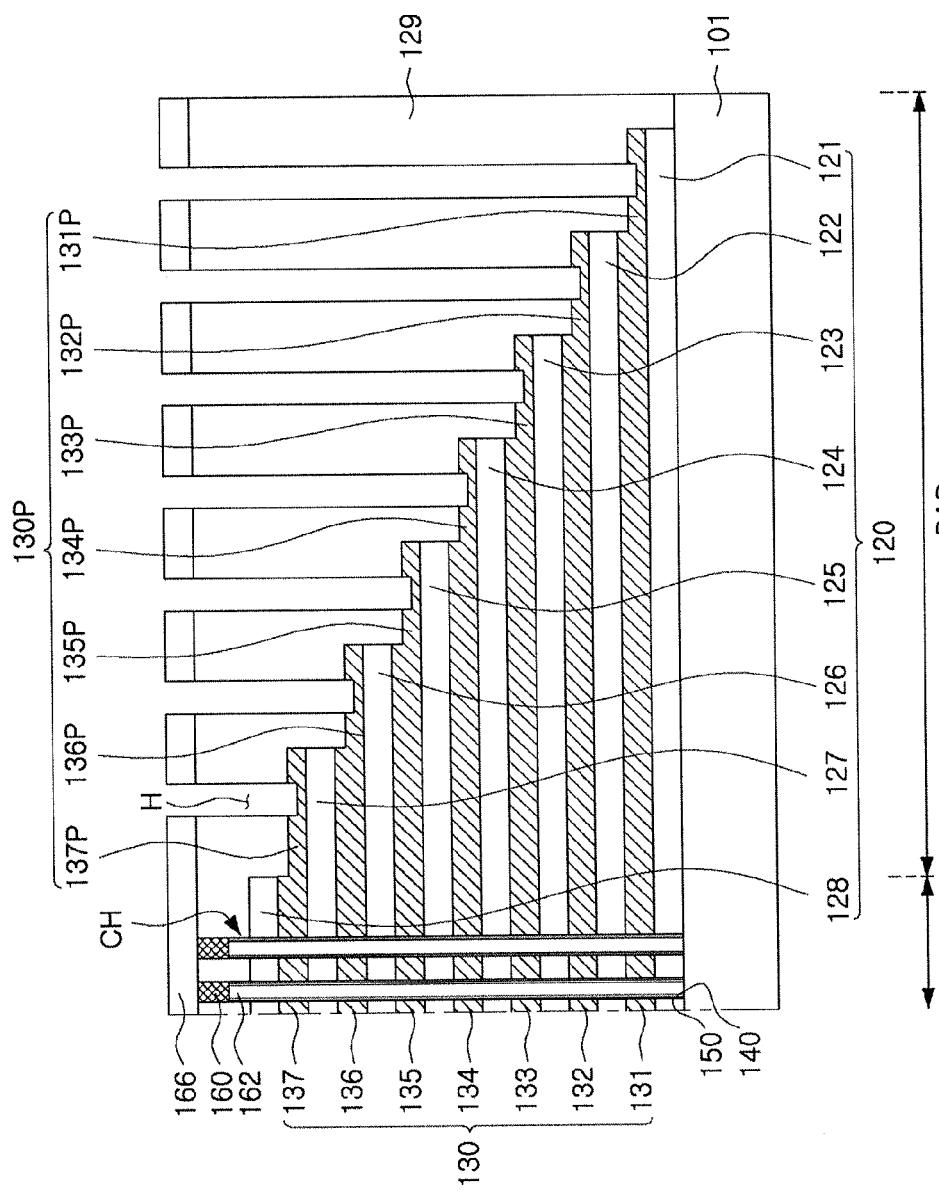

With reference to FIG. 10J, contact holes H may be formed by removing a portion of the pad insulating layer 129.

The contact holes H may be formed using a separate mask pattern after forming the separate mask pattern having openings corresponding to regions in which the contact plugs 180 (see FIG. 4) are to be formed. The contact holes H may be formed to allow the gate pads 130P to be exposed. In example embodiments, the contact holes H allow the gate pads 130P to be recessed by a predetermined depth.

Figure 10K:
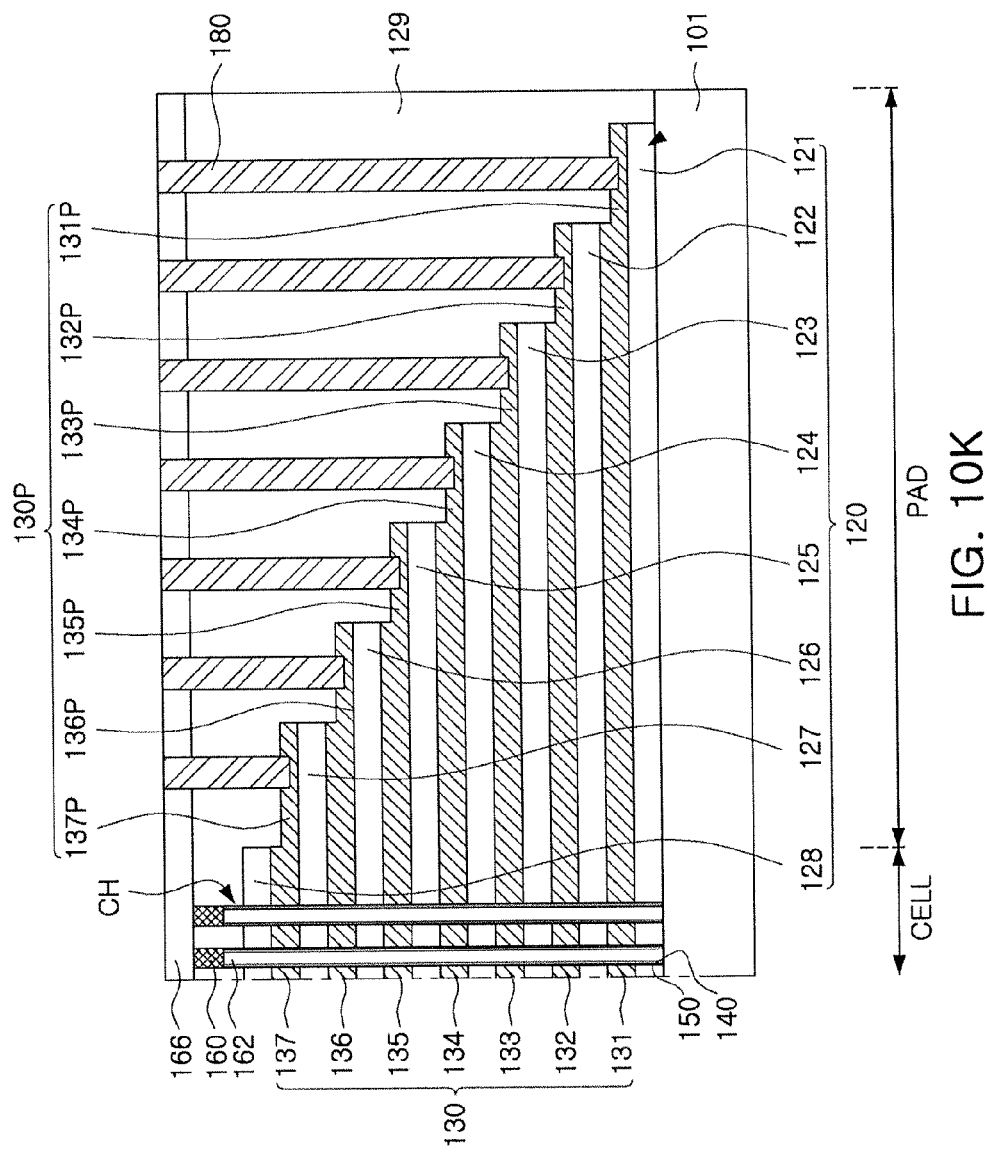

With reference to FIG. 10K, the contact plugs 180 may be formed.

First, the contact holes H may be filled with a conductive material to form the contact plugs 180.

Subsequently, the second wiring lines 190 may be formed on the contact plugs 180 together referring to FIG. 4. In the cell region CELL, the channel plugs 175 may be formed on the channel pads 160, and then, the first wiring lines 170 may be formed thereon. In example embodiments, the disposition of the first and second wiring lines 170 and 180 may be as illustrated in the drawings. In example embodiments, the first and second wiring lines 170 and 180 may be disposed at different heights.

FIGS. 11A to 11D schematically illustrate drawings of principal processes of a method of manufacturing a semiconductor device according to an example embodiment. In FIGS. 11A to 11D, a method of manufacturing a semiconductor device 100*b* of FIG. 8 is illustrated. Hereinafter, a description overlapped with the description of FIGS. 10A to 10K will be omitted.

As described above with reference to FIG. 10A, a stacked structure in which the sacrificial layers 110 and the interlayer insulating layer 120 are stacked may be first formed.

Figure 11A:
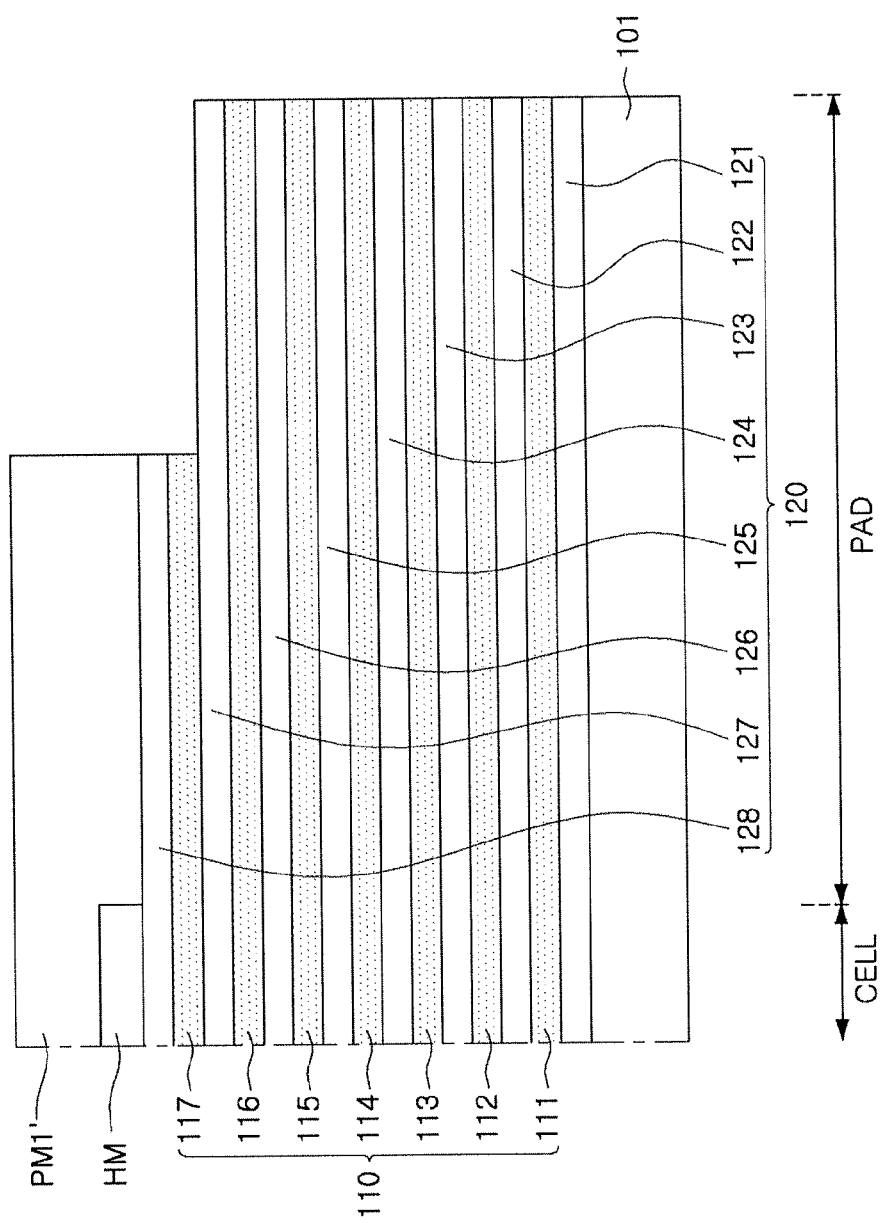
FIGS. 11A to 11D schematically illustrate drawings of principal processes of a method of manufacturing a semiconductor device according to an example embodiment.

Then, with reference to FIG. 11A, a hard mask layer HM and a first photomask layer PM1' may be formed on the interlayer insulating layer 120 and the sacrificial layers 110 stacked on each other, and portions of the interlayer insulating layers 120 and the sacrificial layers 110 may be removed using the hard mask layer HM and the first photomask layer PM1'.

First, a process of removing portions of the sacrificial layers 110 may be performed at a position thereof corresponding to the gate pads 130Pe of the second group ST2 of FIG. 8, and the first photomask layer PM1' may be formed to correspond to a length of a lowermost gate pad 134Pe (see FIG. 8) among the gate pads 130Pe of the second group ST2. Regions of the sacrificial layers exposed by the first photomask layer PM1' may be removed using dry etching or wet etching.

Figure 11B:
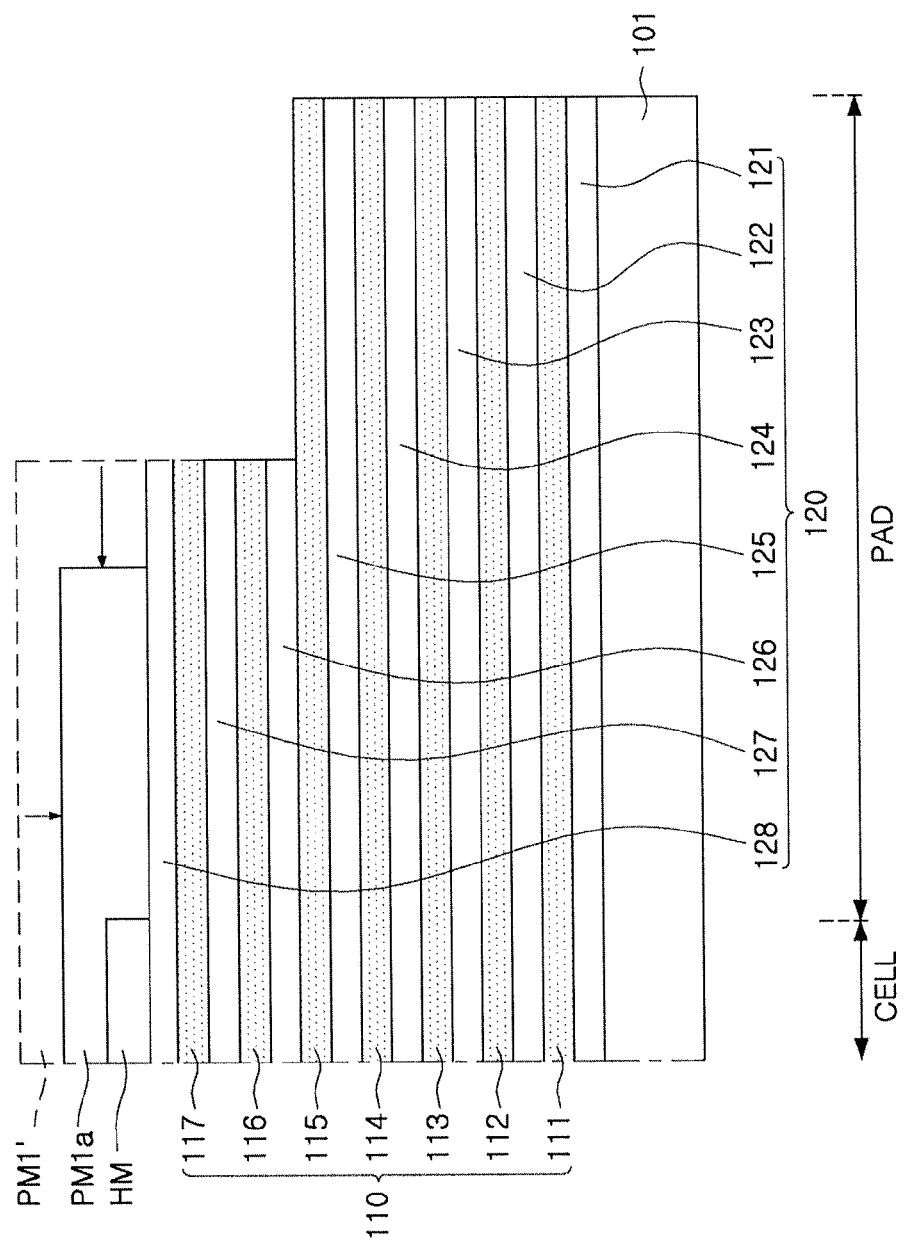

With reference to FIG. 11B, a trimming mask layer PM1*a* may be formed by trimming the first photomask layer PM1'.

The trimming process may be a process of reducing the size of the first photomask layer PM1' using a dry etching or a wet etching, and the first trimming mask layer PM1*a* covering a reduced area such that an end thereof corresponds to a length of the gate pad 135Pe (see FIG. 8) may be formed. A height of the first photomask layer PM1' may also be lowered by the trimming process.

Figure 11C:
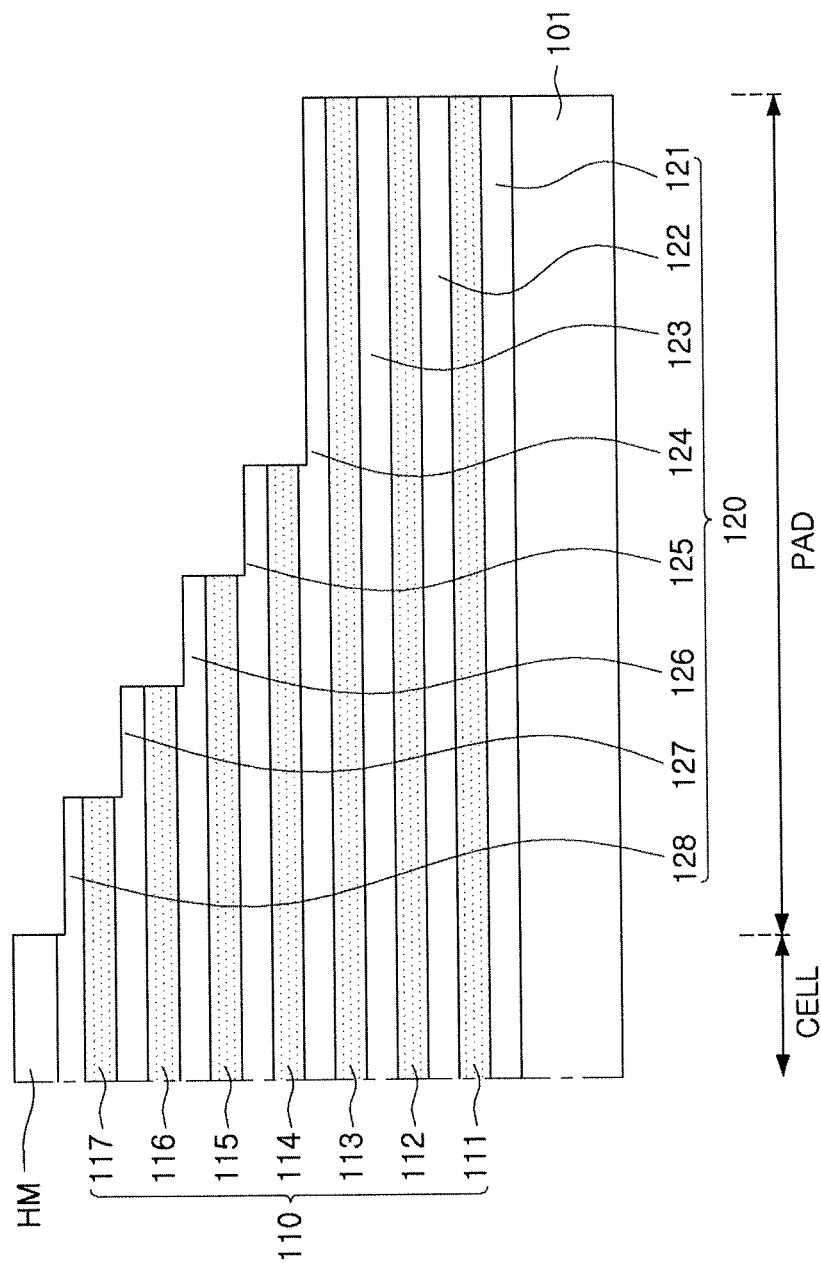

With reference to FIG. 11C, portions of all of fourth to seventh sacrificial layers 114 to 117 to be replaced with the gate pads 130Pe of the second group ST2 of FIG. 8 may be removed by a cutting process.

The fourth to seventh sacrificial layers 114 to 117 may be subjected to a cutting process to have different lengths by repeatedly performing the trimming process as described with reference to FIG. 11B, and then, the trimming mask layer PM1*a* may be removed.

At the time of removing the trimming mask layer PM1*a*, the exposed interlayer insulating layers 120 may also be partially removed, and the exposed interlayer insulating layers 120 on the fourth to seventh sacrificial layers 114 to 117 may have thicknesses reduced at a degree to which the exposed interlayer insulating layers 120 may have substantially uniform thicknesses.

Figure 11D:
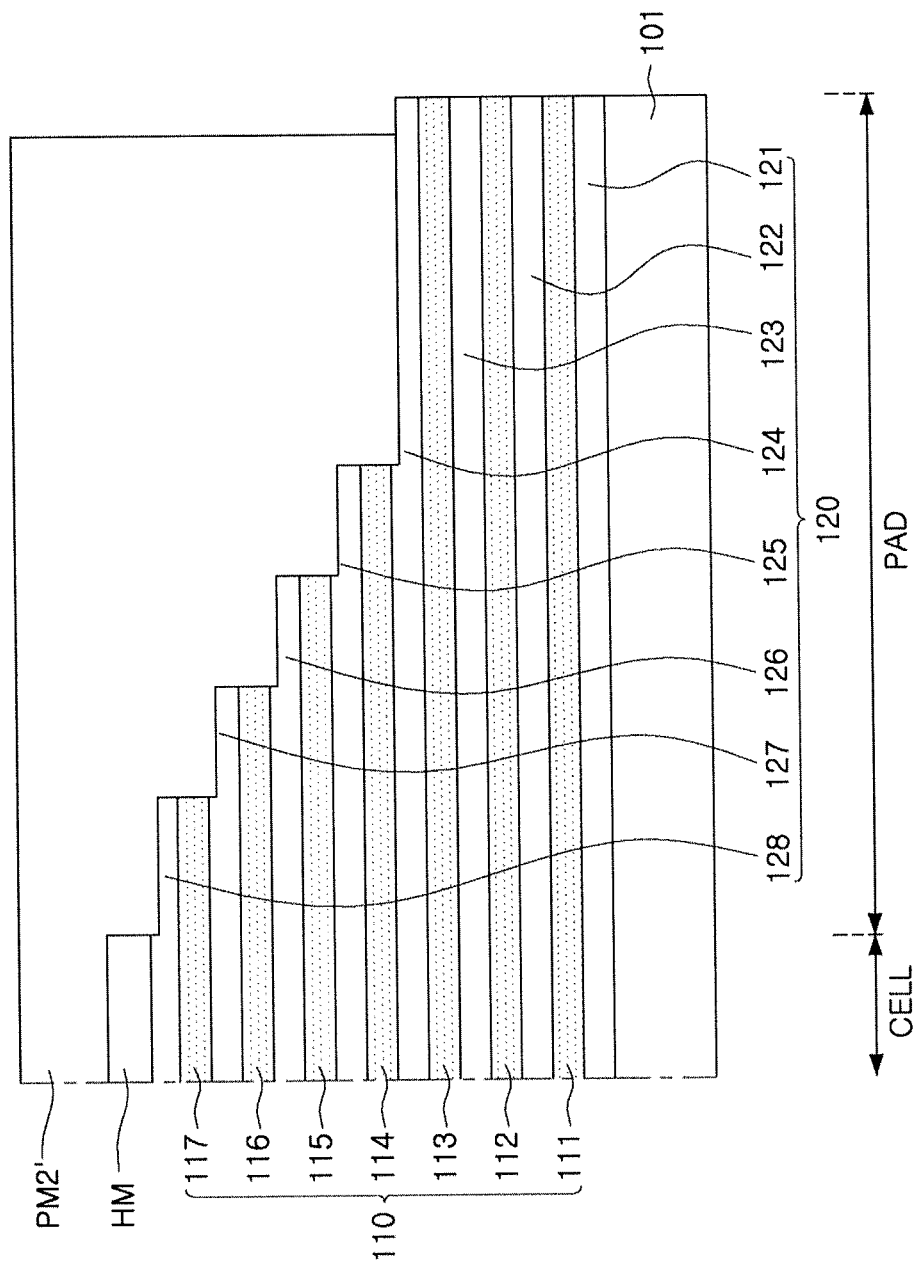

With reference to FIG. 11D, a second photomask layer PM2' may be formed to remove portions of the sacrificial layers 110 provided in positions corresponding to the gate pads 130Pe of the first group ST1 of FIG. 8 by a cutting process.

The second photomask layer PM2' may be formed to correspond to a length of a lowermost gate pad 131Pe (see FIG. 8) among the gate pads 130Pe of the first group ST1. The interlayer insulating layers 120 and the sacrificial layers 110 exposed by the second photomask layer PM2' may be removed using drying etching or wet etching.

Next, portions of all of the sacrificial layers 110 may be removed by a cutting process by repeatedly performing the trimming process and the etching process as described above with reference to FIGS. 11B and 11C. As such, the number of formation and removal processes of the photomask layer may be reduced using the trimming process. At the time of removing the photomask layer, portions of the exposed interlayer insulating layers 120 may also be removed, and the interlayer insulating layers 120 on the sacrificial layers 110 subjected to the cutting process using a single photomask layer may have thicknesses reduced by the same thickness. Oxidation thicknesses of the sacrificial layers 110 below such the interlayer insulating layers 120, as described above with reference to FIG. 10E, may be the same in a single group ST1 and ST2. Finally, the gate pads 130Pe formed may have different thicknesses in contact regions based on units of groups ST1 and ST2 as illustrated in FIG. 8.

Next, manufacturing of a semiconductor device 100*b* of FIG. 8 may be completed by performing the process described above with reference to FIGS. 10E to 10K.

Figure 12:
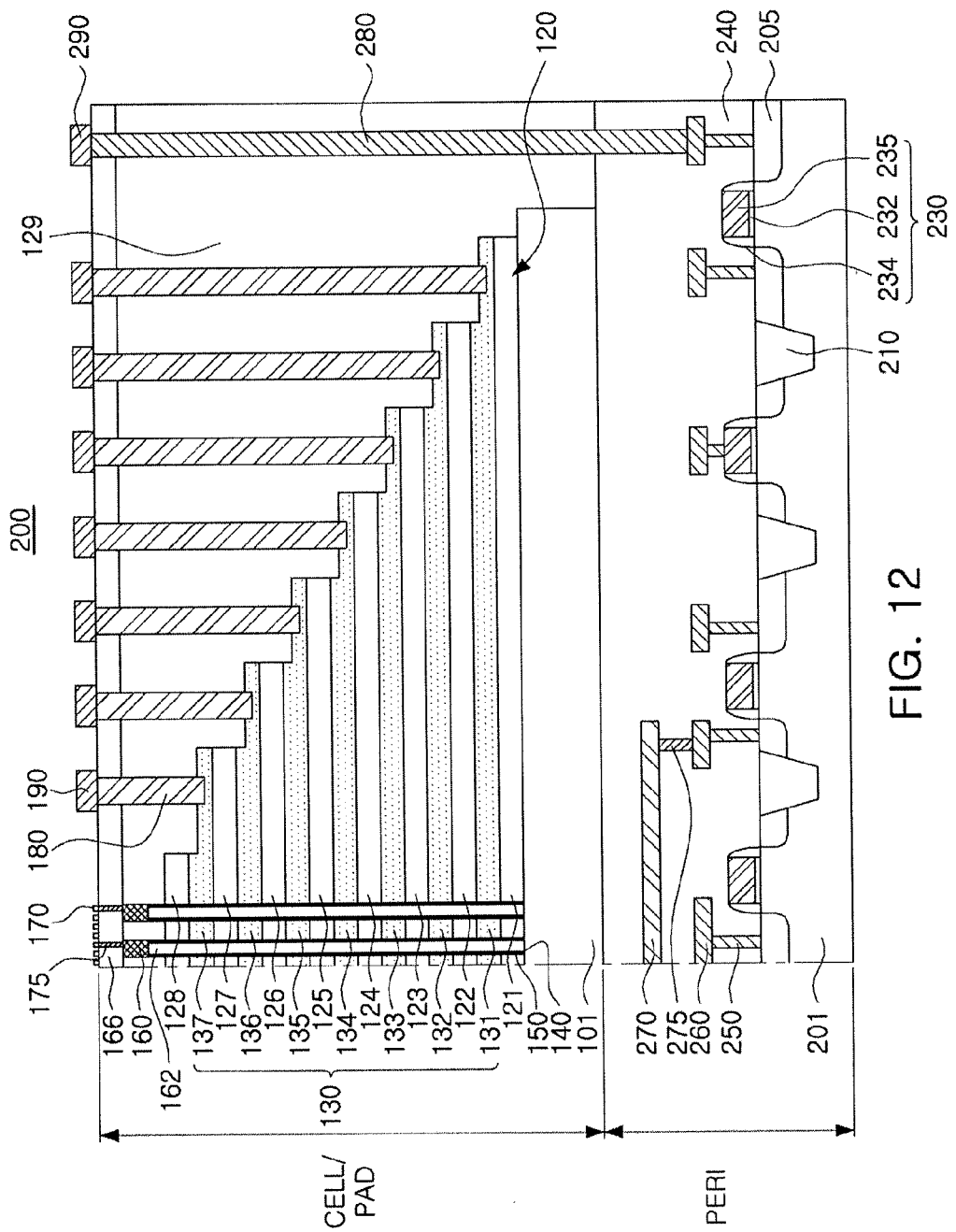
FIG. 12 illustrates a schematic perspective view of a semiconductor device according to an example embodiment.

FIG. 12 illustrates a schematic perspective view of a semiconductor device according to an example embodiment.

With reference to FIG. 12, a semiconductor device 200 may include a cell region CELL, a pad region PAD, and a peripheral circuit region PERI.

The peripheral circuit region PERI may correspond to a region in which the driving circuit 30 of the memory cell array 20 of FIG. 1 is disposed. The peripheral circuit region PERI may be disposed below the cell region CELL and the pad region PAD. According to example embodiments, the peripheral circuit region PERI may also be disposed on the cell region CELL and the pad region PAD or may be disposed on at least one side thereof.

The cell region CELL and the pad region PAD may include gate electrodes 130, interlayer insulating layers 120, channel holes CH, gate pads 130P extending horizontally from the gate electrodes 130, and contact plugs 180 connected to the gate pads 130P.

In the example embodiment, the cell region CELL and the pad region PAD are illustrated as having a structure the same as that of the example embodiment of FIG. 4. The cell region CELL and the pad region PAD may include a semiconductor device according to various example embodiments as described above with reference to FIGS. 6A to 9.

The peripheral circuit region PERI may include a base substrate 201, circuit devices 230 disposed on the base substrate 201, first and second contact plugs 250 and 275, and first and second wiring lines 260 and 270.

The base substrate 201 may have an upper surface extending in an X direction and a Y direction. In the base substrate 201, a device isolation layer 210 may be formed so that an active region may be defined thereby. A doping region 205 including an impurity may be disposed in a portion of the active region. The base substrate 201 may include a semiconductor material, for example, a group IV semiconductor material, a group III-V compound semiconductor material, or a group II-VI oxide semiconductor material.

The circuit device 230 may include a planar transistor. The respective circuit device 230 may include a circuit gate insulating layer 232, a spacer layer 234, and a circuit gate electrode 235. At two sides of the circuit gate electrode 235, the doping regions 205 may be disposed within the base substrate 201 to serve as a source region or a drain region of the circuit device 230.

A peripheral region insulating layer 240 may be disposed on the circuit device 230 on the base substrate 201.

The first contact plugs 250 may penetrate through the peripheral region insulating layer 240 to be connected to the doping region 205 or the circuit gate electrode 235. The second contact plugs 275 may be disposed between the first and second wiring lines 260 and 270. An electrical signal may be applied to the circuit devices 230 via the first and second contact plugs 250 and 275, and the first and second wiring lines 260 and 270.

The semiconductor device 200 may further include connection wiring structures 280 and 290 connecting the pad region PAD and the peripheral circuit region PERI to each other.

The connection wiring structures 280 and 290 may be disposed to connect at least one of the first and second wiring lines 170 and 190 to, for example, the circuit devices 230 of the peripheral circuit region PERI, the first and second wiring lines 170 and 190 being connected to the gate electrodes 130, and the channel region 140 of the cell region CELL to extend to the pad region PAD.

The peripheral circuit region PERI may first be formed, and then, the substrate 101 of the cell region CELL and the pad region PAD may be formed thereon to form the cell region CELL and the pad region PAD. The substrate 101 may be, for example, smaller than that of the base substrate 201. The substrate 101 may include polycrystalline silicon or may be single-crystallized after being formed in amorphous silicon.

Figure 13:
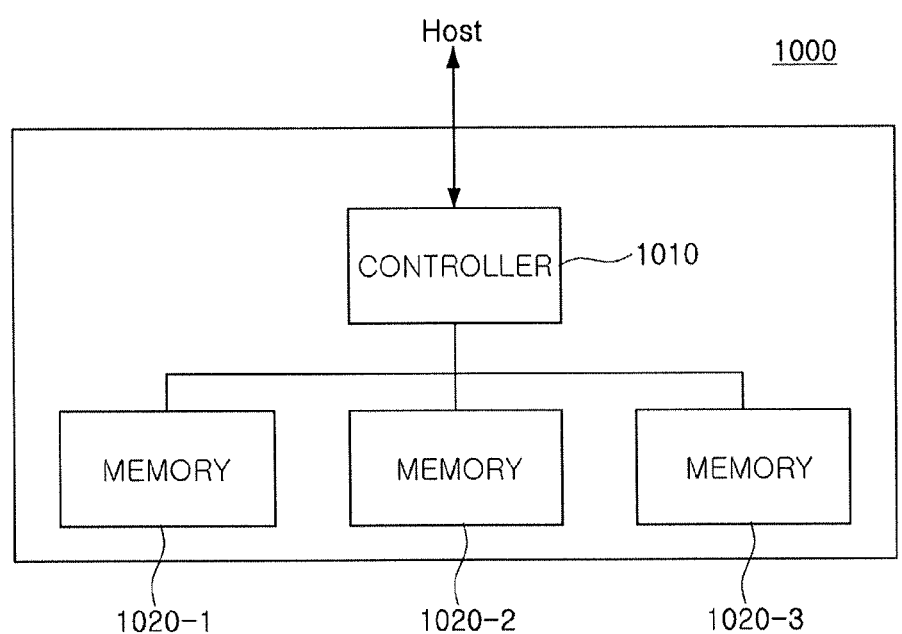
FIG. 13 illustrates a block diagram of a storage device including a semiconductor device according to an example embodiment.

FIG. 13 illustrates a block diagram of a storage device including a semiconductor device according to an example embodiment.

With reference to FIG. 13, a storage apparatus 1000 according to an example embodiment may include a controller 1010 communicating with a host HOST and memories 1020-1, 1020-2, and 1020-3 storing data therein. The respective memories 1020-1, 1020-2, and 1020-3 may include a semiconductor device according to various example embodiments as described above with reference to FIGS. 3 to 9.

The host HOST communicating with the controller 1010 may be various electronic devices in which the storage apparatus 1000 is installed, and for example, may be a smartphone, a digital camera, a desktop computer, a laptop computer, a portable media player, or the like. The controller 1010 may receive a data writing or data reading request transferred by the host HOST to enable data to be written to the memories 1020-1, 1020-2, and 1020-3 or may generate a command CMD to allow data to read from the memories 1020-1, 1020-2, and 1020-3.

As illustrated in FIG. 13, one or more memories 1020-1, 1020-2, and 1020-3 may be connected to the controller 1010 in parallel within the storage apparatus 1000. The storage apparatus 1000 having a large capacity as in a solid state driver (SSD) may be implemented by connecting the plurality of memories 1020-1, 1020-2, and 1020-3 to the controller 1010 in parallel.

Figure 14:
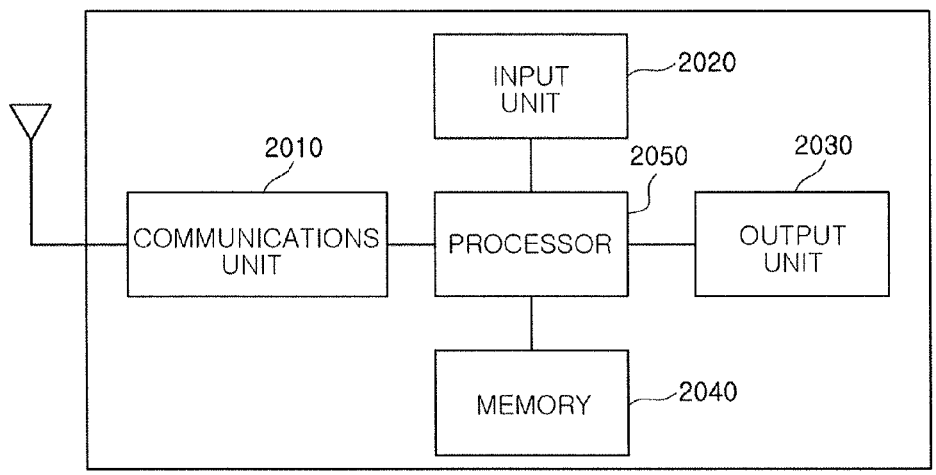
FIG. 14 illustrates a block diagram of an electronic device including a semiconductor device according to an example embodiment.

FIG. 14 illustrates a block diagram of an electronic device including a semiconductor device according to an example embodiment.

With reference to FIG. 14, an electronic device 2000 according to an example embodiment may include a communications unit 2010, an input unit 2020, an output unit 2030, a memory 2040, and a processor 2050.

The communications unit 2010 may include a wired and wireless communications module and may include a wireless internet module, a near-field communications module, a global positioning system (GPS) module, a mobile communications module, and the like. The wired and wireless communications module included in the communications unit 2010 may be connected to an external communications network via various communications protocols to transmit or receive data.

The input unit 2020 may be a module provided to control operations of the electronic device 2000 by a user, and may include a mechanical switch, a touchscreen, a sound recognition module, and the like. The input unit 2020 may also include a mouse operating in a trackball or laser pointer scheme or the like, or a finger mouse device, and also, may further include various sensor modules through which data may be input by a user.

The output unit 2030 may output information processed by the electronic device 2000 in audio or visual form, and the memory 2040 may store a program for processing or controlling by the processor 2050, data, or the like. The processor 2050 may transfer a command to the memory 2040 according to a required operation to write data thereto or read data therefrom.

The memory 2040 may be embedded in the electronic device 2000 or may communicate with the processor 2050 via a separate interface. In the case of communicating with the processor 2050 via the separate interface, the processor 2050 may write data to the memory 2040 or read data therefrom via various interface standards such as SD, SDHC, SDXC, MICRO SD, USB, and the like.

The processor 2050 may control operations of respective parts included in the electronic device 2000. The processor 2050 may perform controlling and processing relevant to voice communications, video communications, data communications, and the like, or may also perform controlling and processing for multimedia playback and management. The processor 2050 may process an input transferred through the input unit 2020 by a user and may output the result thereof via the output unit 2030. The processor 2050 may write data required to control operations of the electronic device 2000 to the memory 2040 or read data therefrom. At least one of the processor 2050 and the memory 2040 may include a semiconductor device according to various example embodiments as described above with reference to FIGS. 3 to 9.

Figure 15:
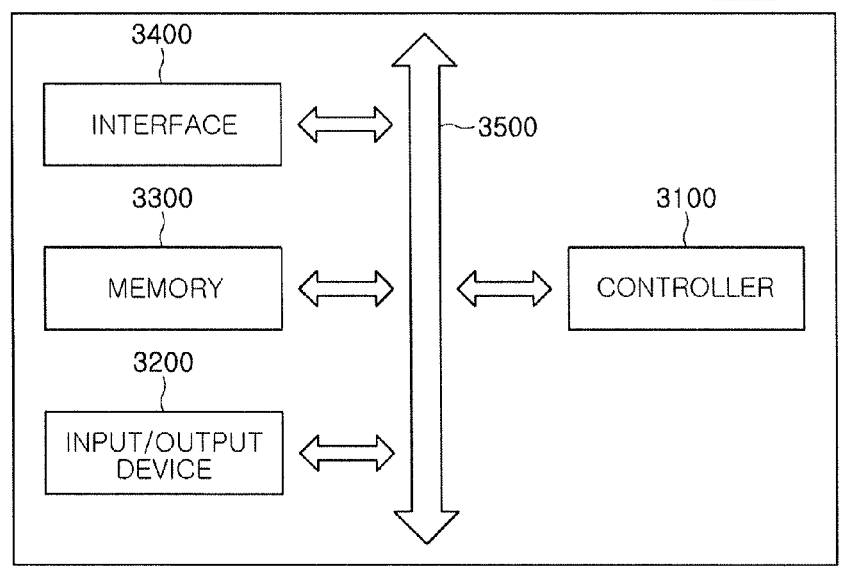
FIG. 15 illustrates a schematic diagram of a system including a semiconductor device according to an example embodiment.

FIG. 15 illustrates a schematic diagram of a system including a semiconductor device according to an example embodiment.

With reference to FIG. 15, a system 3000 may include a controller 3100, an input/output device 3200, a memory 3300, and an interface 3400. The system 3000 may be a mobile system or a system transmitting or receiving information. The mobile system may be a personal digital assistant (PDA), a portable computer, a web tablet, a wireless phone, a mobile phone, a digital music player or a memory card.

The controller 3100 may execute a program and may serve to control the system 3000. The controller 3100 may be provided as, for example, a microprocessor, a digital signal processor, a microcontroller or a device similar thereto.

The input/output device 3200 may be used to input or output data of the system 3000. The system 3000 may be connected to an external device, for example, a personal computer or a network to exchange data therebetween using the input/output device 3200. The input/output device 3200 may be provided as, for example, a keypad, a keyboard, or a display.

The memory 3300 may store a code and/or data for operations of the controller 3100 therein, and/or may store data processed by the controller 3100 therein. The memory 3300 may include a semiconductor device according to one example embodiment among example embodiments.

The interface 3400 may serve as a data transmission path between the system 3000 and an external, different device. The controller 3100, the input/output device 3200, the memory 3300, and the interface 3400 may communicate with one another via a bus 3500.

At least one of the controller 3100 and the memory 3300 may include a semiconductor device according to example embodiments as described above with reference to FIGS. 3 to 9.

By way of summation and review, in vertical nonvolatile memory devices, portions of gate electrodes may be removed such that gate electrodes have different lengths in a pad region and may be connected to upper wiring structures.

In embodiments, regions in which gate electrodes extend to a pad region are referred to as gate pads, and the gate pads may have regions in which thicknesses may be lower than those of the gate electrodes.

For example, the gate pads may have thicknesses reduced at ends thereof connected to contact plugs so as to be relatively thin. Such a structure may be formed by a process in which a photo mask layer is removed when sacrificial layers to be replaced with gate electrodes are subjected to a cutting process. In the pad region, interlayer insulating layers on the sacrificial layers may be partially removed to be reduced in thicknesses or entirely removed. The sacrificial layers may be oxidized to a predetermined depth from upper surfaces thereof in a subsequent process, so as not to be removed when the sacrificial layers are replaced with gate electrodes in a replacement process. A gate electrode may have a reduced thickness in a corresponding region.

As an approach to increasing the degree of integration of semiconductor devices, a semiconductor device may have a vertical transistor structure instead of a planar transistor structure. An embodiment may provide a semiconductor device having improved integration. For example, as set forth above, according to example embodiments, as respective gate pads include regions in which thicknesses thereof are reduced, respectively, a semiconductor device having improved integration may be provided.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
  gate electrodes perpendicularly stacked on a substrate;
  channel holes extending perpendicularly to the substrate, the channel holes penetrating through the gate electrodes, the channel holes having a channel region;
  gate pads extended from the gate electrodes by different lengths; and
  contact plugs connected to the gate pads,
  at least a portion of the gate pads having a region having a thickness less than a thickness of the gate electrode connected to the at least a portion of the gate pads.

2. The semiconductor device as claimed in claim 1, wherein:
  the gate pads include contact regions in which lower gate pads extend further than upper gate pads connected to the contact plugs, and
  a thickness of the gate pad in the contact region is less than a thickness of the gate electrode.

3. The semiconductor device as claimed in claim 2, wherein the gate pads have thicknesses less than thicknesses of the gate electrodes in an entirety of the contact regions.

4. The semiconductor device as claimed in claim 2, wherein the gate pads have thicknesses continuously and gradually reduced in the contact regions.

5. The semiconductor device as claimed in claim 2, wherein each of the gate pads has a curved portion in which a thickness of the gate pad is discontinuously and rapidly reduced in a vicinity of the contact region, each of the gate pads extending horizontally in a region except for the curved portion.

6. The semiconductor device as claimed in claim 1, wherein a difference in thicknesses between the gate pads and the gate electrodes connected to the gate pads is different in each of the gate pads.

7. The semiconductor device as claimed in claim 6, wherein the difference in thicknesses in the gate pads is increased in an upward direction from an upper surface of the substrate.

8. The semiconductor device as claimed in claim 6, wherein the difference in thicknesses in the gate pads is increased in an upward direction from an upper surface of the substrate among group units including two or more of the gate pads.

9. The semiconductor device as claimed in claim 1, further comprising an etch-stop layer on the gate pads,
  wherein the contact plugs penetrate through the etch-stop layer.

10. The semiconductor device as claimed in claim 9, wherein the etch-stop layer is in contact with the gate pads.

11. A semiconductor device, comprising:
  gate electrodes stacked perpendicularly on a substrate;
  gate pads having contact regions, the gate pads extending from the gate electrodes by different lengths; and
  contact plugs connected to the gate pads in the contact regions,
  at least a portion of the gate pads having a reduced thickness in the contact regions.

12. The semiconductor device as claimed in claim 11, wherein the contact regions include regions in which a lower gate pad among the gate pads extends further than an upper gate pad among the gate pads.

13. The semiconductor device as claimed in claim 11, wherein each of the gate pads has a step portion or a curved portion such that each of the gate pads has the reduced thickness in the contact regions.

14. The semiconductor device as claimed in claim 11, wherein a difference in thicknesses of the gate electrode and the gate pad connected to the gate electrode is in a range of about 5 Å to about 100 Å.

15. The semiconductor device as claimed in claim 11, wherein a degree of reduction in thicknesses of the gate pads is in proportion to or in inverse proportion to a distance between the gate pads and the substrate.

* * * * *